United States Patent
Harada

(10) Patent No.: US 6,777,811 B2
(45) Date of Patent: Aug. 17, 2004

(54) SEMICONDUCTOR DEVICE AND ITS FABRICATION METHOD

(75) Inventor: Takeshi Harada, Niigata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/207,821

(22) Filed: Jul. 31, 2002

(65) Prior Publication Data

US 2003/0025207 A1 Feb. 6, 2003

(30) Foreign Application Priority Data

Aug. 1, 2001 (JP) ........................................ 2001-233171

(51) Int. Cl.[7] .......................... H01L 23/48; H01L 23/52; H01L 23/40
(52) U.S. Cl. ........................................ 257/762; 257/770
(58) Field of Search ................................ 257/762, 770, 257/768, 751, 767, 754; 438/630, 687, 649

(56) References Cited

U.S. PATENT DOCUMENTS

| | | | |
|---|---|---|---|
| 5,447,887 A | | 9/1995 | Filipial et al. |
| 5,801,444 A | * | 9/1998 | Aboelfotah et al. |
| 6,017,818 A | | 1/2000 | Lu |
| 6,069,093 A | | 5/2000 | Tada et al. |
| 6,090,702 A | | 7/2000 | Okamoto |
| 6,156,655 A | * | 12/2000 | Huang et al. |
| 6,214,731 B1 | * | 4/2001 | Nogami et al. |
| 6,569,767 B1 | * | 5/2003 | Fujisawa et al. |
| 6,573,542 B2 | * | 6/2003 | Bruchhaus et al. |

FOREIGN PATENT DOCUMENTS

EP 0 769 806 A2 4/1997

OTHER PUBLICATIONS

Reactively sputtered TIN as a diffusion barrier between Cu and Sl, Shi–Wang, Ivo Reaijmakers, Brad J. Burrow, Sailesh Suther, Shailesh Redkar, and Ki–Bum Kim, Philips R & D Center, Signetics Company, pp. 5176–5187, J. Appl Phys. 68 (10), Nov. 15, 1990, (Copyright 1990 American Institute of Physics), (Received May. 2, 1990; accepted for publication Aug. 1, 1990).

Chemical vapor deposition of Titanium–silicon–nitride films, Paul Martin Smith and J. S. Custer, (Received Mar. 17, 1997; accepted for publication Apr. 9, 1997), Appl. Phys. Lett. 70 (23), Jun. 8, 1997 American Institute of Physics).

An amorphous Ti–Si–N Diffusion Barrier Layer for Cu Interconnections, Tadashi Iijima, Yoshiaki Shimooka, and Kyoichi Suguro, Nonmembers, (Electronics and Communications in Japan, Part 2, vol. 78, No. 12, 1995)(ISSN8758–663X/95/0012–0068, 1996 Scipta Technica, Inc.).

* cited by examiner

Primary Examiner—S. V. Clark
(74) Attorney, Agent, or Firm—McDermott, Will & Emery

(57) ABSTRACT

The portion of a lower-layer wiring contacting with a metal film in a via hole is a copper silicide layer. Moreover, a laminated structure of a titanium-nitride-silicide layer and a titanium nitride film or the laminated structure of a metal film, titanium-nitride-silicide layer, and titanium nitride film is formed between an insulating film and a wiring copper film embedded in a concave portion formed in the insulating film.

23 Claims, 17 Drawing Sheets

SEMICONDUCTOR DEVICE AND ITS FABRICATION METHOD

BACKGROUND OF THE INVENTION

The present invention relates to a semiconductor device having a copper wiring and its fabrication method.

As a semiconductor device is more highly integrated, the width of a wiring and the interval between wirings are decreased and resultantly the resistance of a wiring or the capacitance between wirings is increased. When the resistance or capacity increases, the speed for an electrical signal to pass through a wiring lowers and resultantly the operation speed of a semiconductor device is limited. To prevent the above phenomenon, a method for forming a low-resistance wiring by using a copper (Cu) film has been positively studied in recent years.

A conventional semiconductor device, specifically a semiconductor device having a wiring formed by a Cu film and its fabrication method are described below by referring to the accompanying drawings.

FIGS. 21 to 26 are sectional views showing steps of a conventional semiconductor-device fabrication method.

First, as-shown in FIG. 21, a first silicon-dioxide ($SiO_2$) film 3, a silicon nitride ($Si_3N_4$) film 4, and a second $SiO_2$ film 5 are formed in order on a semiconductor substrate 1 provided with a lower-layer wiring 2 formed by a Cu film.

Then, as shown in FIG. 22, a via hole 6 reaching the lower-layer wiring 2 is formed on the first $SiO_2$ film 3 and the $Si_3N_4$ film 4 and a wiring groove 7 connecting with the via hole 6 is formed on the second $SiO_2$ film 5 by alternately applying the lithography method and the dry etching method twice each. In this case, a Cu film constituting the lower-layer wiring 2 is exposed to the bottom of the via hole 6 while the surface of the Cu film is immediately oxidized by oxygen ($O_2$) in the air. Thereby, copper oxide {CuOx(x>0)} layer 8 is formed on the portion of the lower-layer wiring 2 exposed to the via hole 6.

Then, as shown in FIG. 23, the CuOx layer 8 and a part of a Cu film forming lower-layer wiring 2 is removed by the sputter-etching method using an inert gas. However, because the removed portion is small compared to the entire lower-layer wiring 2, the removed portion is omitted from FIG. 23 downward.

Then, as shown in FIG. 24, a titanium nitride (TiN) film 9 is formed on the second $SiO_2$ film 5 including insides of the via hole 6 and wiring groove 7 by the chemical vapor deposition method. Thereby, the TiN film 9 is formed on the portion of the lower-layer wiring 2 exposed to the via hole 6 (that is, on the bottom face of the via hole 6), the wall surface of the via hole 6, and the wall surface and bottom face of the wiring groove 7 respectively.

Then, as shown in FIG. 25, a first Cu film 10 is formed on the TiN film 9 by the physical vapor deposition method and then, a second Cu film 11 is formed on the first Cu film 10 by the plating method to embed the via hole 6 and the wiring groove 7 by the second Cu film 11.

Finally, as shown in FIG. 26, the portions of the TiN film 9, first Cu film 10, and second Cu film 11 outside the wiring groove 7 are removed by the chemical-mechanical polishing method (CMP method). Thereby, an upper-layer wiring 12 is formed which is constituted by the TiN film 9, first Cu film 10, and second Cu film 11 embedded in the via hole 6 and wiring groove 7.

In the case of the conventional semiconductor device shown in FIG. 26, the TiN film 9 functions as a barrier metal film for preventing diffusion of Cu atoms contained in the first Cu film 10 and second Cu film 11.

However, the above-described prior art has the following problems.

FIGS. 27 to 30 are illustrations for explaining problems of the prior art. In FIGS. 27 to 30, members same as those of the conventional semiconductor device shown in FIGS. 21 to 26 are provided with the same symbols and their description is omitted.

As shown in FIG. 27, the first problem of the prior art is that when operating a semiconductor device for a long time at a high temperature, the portion of the TiN film 9 nearby the lower-layer wiring 2 is oxidized and thereby, a high-resistance titanium oxide ($TiO_2$) layer 13 is formed. When the $TiO_2$ layer 13 is formed, the connection resistance between the lower-layer wiring 2 and the upper-layer wiring 12 increases and thereby, the operation speed of the semiconductor device lowers. This phenomenon specifically occurs due to the following mechanism. That is, to form the via hole 6 or wiring groove 7 by the dry etching method, oxygen (O) atoms contained in the first $SiO_2$ film 3 or second $SiO_2$ film 5 are implanted into a Cu film constituting the lower-layer wiring 2 and resultantly, an oxygen-atom-containing layer 14 is formed in the lower-layer wiring 2. The oxygen-atom-containing layer 14 is distributed in a range wider than the CuOx layer 8 shown in FIG. 22. When operating a semiconductor device for a long time under the above state, oxygen atoms contained in the oxygen-atom-containing layer 14 move toward the upper-layer 12 and resultantly, the portion of the TiN film 9 nearby the lower-layer wiring 2 is oxidized and the $TiO_2$ layer 13 is formed.

Then, as shown in FIG. 28, the second problem of the prior art is that Cu atoms pass through the TiN film 9 and reaches the first $SiO_2$ film 3 and second $SiO_2$ film 5 when using a semiconductor device for a long time at a high temperature because the power for preventing diffusion of Cu atoms contained in the first Cu film 10 and second Cu film 11 by the TiN film 9 is not sufficient (arrow in FIG. 28 shows diffusion direction of Cu atoms). Cu atoms reaching the first $SiO_2$ film 3 and second $SiO_2$ film 5 form mobile ions in the first $SiO_2$ film 3 and second $SiO_2$ film 5 and thereby, leak current increases between adjacent vias or wirings (that is upper-layer wiring 12) and resultantly the semiconductor device malfunctions.

Then, the third problem of the prior art is that when removing the CuOx film 8 and a part of a Cu film constituting lower-layer wiring 2 by the sputter-etching method using an inert gas (refer to FIG. 23), Cu atoms contained in the lower-layer wiring 2 are scattered and attach to the wall surface of the via hole 6 or wiring groove 7 and thereby, a Cu layer 15 is formed as shown in FIG. 29. When the Cu layer 15 is formed on the wall surface of the via hole 6 or wiring groove 7, many Cu atoms are diffused in the first $SiO_2$ film 3 and second $SiO_2$ film 5 and thereby, adjacent vias or wirings are unexpectedly electrically connected each other and resultantly the yield of semiconductor devices is extremely lowered.

Finally, the fourth problem of the prior art is that when removing the portions of the TiN film 9, first Cu film 10, and second Cu film 11 outside the wiring groove 7 by the CMP method (refer to FIGS. 25 and 26), exfoliation (refer to the portion enclosed by the broken line in FIG. 30) occurs at the interface between the second $SiO_2$ film 5 and the TiN film 9, as shown in FIG. 30. When the TiN film 9 is exfoliated from the second $SiO_2$ film 5, the first Cu film 10 and second Cu film 11 are also exfoliated from the second $SiO_2$ film 5 with moving of the polishing cloth and thereby, a laminated wiring structure formed on a semiconductor substrate 1 is broken and resultantly the yield of semiconductor devices is extremely lowered.

SUMMARY OF THE INVENTION

In view of the above mentioned, it is an object of the present invention to make it possible to prevent a semiconductor device from malfunctioning and fabricate semiconductor devices at a high yield, while embodying a wiring with low-resistance employing a Cu film.

To achieve the above object, a first semiconductor device of the present invention comprises a lower-layer wiring made of copper or a copper alloy and formed on a semiconductor substrate, an insulating film deposited on the lower-layer wiring and provided with a via hole reaching the lower-layer wiring, and a metal film deposited in the via hole, wherein the portion of the lower-layer wiring contacting with the metal film is a copper-silicide layer.

According to the first semiconductor device, because the portion of the lower-layer wiring contacting with the metal film in the via hole is the copper-silicide layer, it is possible to prevent oxygen atoms which implanted into a copper film or a copper-alloy film (these are respectively hereafter referred to as a copper film) constituting the lower-layer wiring under the dry etching for forming the via hole, from reaching the metal film in the via hole. Therefore, a high-resistance oxidation layer is not formed in the portion of metal film contacting with the lower-layer wiring. Therefore, even when operating the semiconductor device for a long time at a high temperature, it is possible to avoid that the connection resistance between the lower-layer wiring and the upper-layer wiring from increasing and thereby, prevent the operation speed of the semiconductor device from lowering. That is, according to the first semiconductor device, it is possible to solve the first problem of the prior art.

In the case of the first semiconductor device, it is preferable that the thickness of the copper-silicide layer ranges between 0.5 nm and 20 nm (both included).

Thus, it is possible to securely prevent oxygen atoms in the copper film constituting the lower-layer wiring from reaching the metal film in the via hole and moreover prevent the connection resistance between the lower-layer wiring and the upper-layer wiring from being excessively increased by the fact that the copper-silicide layer is excessively thickened.

In the case of the first semiconductor device, it is preferable that the metal film is a titanium-nitride film.

Thus, by using the titanium-nitride film as a barrier film and forming an upper-layer wiring made of a copper film, it is possible to prevent copper atoms contained in the copper film from diffusing.

A second semiconductor device of the present invention comprises an insulating film deposited on a semiconductor substrate and provided with a concave portion, and a wiring metal film embedded in the concave portion and made of copper or a copper alloy, in which a titanium-nitride-silicide layer and a titanium-nitride film are formed in order from the insulating-film side between the insulating film and the wiring metal film.

According to the second semiconductor device, a titanium-nitride-silicide layer and a titanium-nitride film are formed between an insulating film and a wiring copper film embedded in a concave portion formed in the insulating film.

In this case, the laminated structure of the titanium-nitride-silicide layer and the titanium-nitride film has the power for preventing diffusion of copper atoms higher than that of a single-layer structure of only the titanium-nitride film or a single-layer structure of only the titanium-nitride-silicide layer. Therefore, because copper atoms contained in the wiring copper film do not easily reach the insulating film, the concentration of copper atoms in the insulating film lowers. Therefore, even when operating the semiconductor device for a long time at a high temperature, it is possible to avoid a leak current between adjacent vias or wirings from increasing and thereby, prevent the semiconductor device from malfunctioning. That is, according to the second semiconductor device, it is possible to solve the second problem of the prior art.

In the case of the second semiconductor device, it is preferable that the thickness of the titanium-silicide layer ranges between 0.5 nm and 10 nm (both included).

Thus, the power for preventing copper atoms from diffusing is securely improved and it is possible to prevent the resistance of a via or wiring from being excessively increased by the fact that the titanium-nitride-silicide layer is excessively thickened.

In the case of the second semiconductor device, it is preferable that the thickness of the titanium-nitride film ranges between 0.5 nm and 10 nm (both included).

Thus, the power for preventing copper atoms from diffusing is securely improved and it is possible to prevent the resistance of a via or wiring from being excessively increased by the fact that the titanium-nitride film is excessively thickened.

A third semiconductor device of the present invention comprises an insulating film deposited on a semiconductor substrate and provided with a concave portion, and a wiring metal film embedded in the concave portion and made of copper or a copper alloy, in which a metal film, a titanium-nitride-silicide layer, and a titanium-nitride film are formed in order from the insulating-film side between the insulating film and the wiring metal film.

According to the third semiconductor device, a metal film, a titanium-nitride-silicide layer, and a titanium-nitride film are formed between an insulating film and a wiring copper film embedded in a concave portion formed in the insulating film. In this case, when using a titanium-nitride film as the metal film, the laminated structure of a titanium-nitride film, a titanium-nitride-silicide layer, and a titanium-nitride film has the power for preventing copper atoms from diffusing higher than that of the laminated structure of a titanium-nitride-silicide layer and a titanium-nitride layer. Therefore, because it is more difficult for copper atoms contained in a wiring copper film to reach an insulating film in comparison with the case of the second semiconductor device of the present invention, the concentration of copper atoms in the insulating film is further lowered. Therefore, even when operating a semiconductor device for a long time at a high temperature, it is possible to securely avoid a leak current between adjacent vias or wirings from increasing and thereby securely prevent the semiconductor device from malfunctioning. That is, according to the third semiconductor device, it is possible to solve the second problem of the prior art.

In the case of the third semiconductor device, it is preferable that the metal film is another titanium-nitride film.

Thus, the power for preventing copper atoms from diffusing is securely improved.

In the case of the third semiconductor device, it is preferable the thickness of the titanium-nitride-silicide layer ranges between 0.5 nm and 10 nm (both included).

Thus, the power for preventing copper atoms from diffusing is securely improved and it is possible to prevent the resistance of a via or wiring from being excessively increased by the fact that the titanium-nitride-silicide layer is excessively thickened.

In the case of the third semiconductor device, it is preferable the thickness of the titanium-nitride film ranges between 0.5 nm and 10 nm (both included).

Thus, the power for preventing copper atoms from diffusing is securely improved and it is possible to prevent the resistance of a via or wiring from being excessively increased by the fact that the titanium-nitride film is excessively thickened.

A first semiconductor-device fabrication method of the present invention comprises a step of forming a lower-layer wiring made of copper or a copper alloy on a semiconductor substrate, a step of forming an insulating film having a via hole reaching the lower-layer wiring on the lower-layer wiring, a step of forming a copper-silicide layer on the portion of the lower-layer wiring exposed to the via hole, and a step of depositing a metal film on the copper silicide layer in the via hole.

According to the first semiconductor-device fabrication method, an insulating film having a via hole is formed on a lower-layer wiring formed by a copper film and then, a copper silicide layer is formed on the portion of the lower-layer wiring exposed to the via hole, and then a metal film is deposited in the via hole. Therefore, because the first semiconductor device of the present invention can be fabricated, it is possible to solve the first problem of the prior art.

Moreover, according to the first semiconductor-device fabrication method, by forming a copper silicide layer in the portion of a lower-layer wiring exposed to a via hole, it is possible to remove a copper oxide layer formed in the portion when forming the via hole. In other words, the bottom of the via hole can be cleaned by a chemical method referred to as copper-silicide formation instead of the conventional sputter etching method. Therefore, it is possible to avoid that copper atoms contained in the lower-layer wiring are scattered and attach to the wall surface of the via hole and then reach the insulating film. Therefore, because adjacent vias are not unexpectedly electrically connected each other, it is possible to prevent the yield of semiconductor devices from lowering. That is, according to the first semiconductor-device fabrication method, it is possible to solve the third problem of the prior art.

In the case of the first semiconductor-device fabrication method, it is preferable that the step of forming the copper silicide layer includes a step of exposing the portion of the lower-layer wiring exposed to the via hole to silane.

Thus, it is possible to securely form a copper silicide layer.

When forming a copper silicide layer by using silane, it is preferable that the step of exposing the portion to the silane includes a step of setting the temperature for heating the semiconductor substrate to 350° C. or higher and moreover setting the product of the partial pressure of the silane and the time for exposing the portion to the silane to about $6.65 \times 10$ Pa·sec or less.

Thus, it is possible to set the thickness of the copper silicide layer to a value between 0.5 nm and 20 nm (both included). As a result, it is possible to securely prevent oxygen atoms in a copper film constituting the lower-layer wiring from reaching the metal film in the via hole and moreover prevent the connection resistance between the lower-layer wiring and the upper-layer wiring from being excessively increased by the fact that the copper silicide layer is excessively thickened.

When forming a copper silicide layer by using silane, it is preferable that the step of exposing the portion to the silane includes a step of setting the temperature for heating the semiconductor substrate to 350° C. or lower and moreover setting the product of the partial pressure of the silane and the time for exposing the portion to the silane to a value between about $6.65 \times 10^{-2}$ and $3.33 \times 10^2$ Pa·sec (both included).

Thus, it is possible to set the thickness of the copper silicide layer to a value between 0.5 nm and 20 nm (both included). As a result, it is possible to securely prevent oxygen atoms in a copper film constituting the lower-layer wiring from reaching the metal film in the via hole and moreover prevent the connection resistance between the lower-layer wiring and the upper-layer wiring from being excessively increased by the fact that the copper silicide layer is excessively thickened.

When forming a copper silicide layer by using silane, it is preferable that the step of forming the copper silicide layer further includes a step of heating the semiconductor substrate at a reduced pressure before the step of exposing the portion to the silane.

Thus, it is possible to decompose a copper oxide layer formed in the portion of the lower-layer wiring exposed to the via hole before forming the copper silicide layer, in other words, it is possible to clean the surface of a copper film constituting the lower-layer wiring before forming the copper silicide layer, it is possible to accelerate uniform formation of the copper silicide layer. Moreover, in this case, it is preferable that the step of heating the semiconductor substrate includes a step of setting the partial pressure of oxygen to about $1.33 \times 10^{-4}$ Pa or lower and setting the temperature and the time for heating the semiconductor substrate to about 300° C. or higher and about 3 sec or more. Thus, it is possible to securely clean the surface of the copper film constituting the lower-layer wiring.

A second semiconductor-device fabrication method of the present invention comprises a step of forming an insulating film having a concave portion on a semiconductor substrate, a step of depositing a silicon layer and a titanium nitride film in order on the insulating film so that the concave portion is embedded up to the middle of it, and a step of depositing a wiring metal film made of copper or a copper alloy on the titanium nitride film so that the concave portion is completely embedded, in which the titanium nitride film is deposited by the chemical vapor deposition method using a compound containing titanium.

According to the second semiconductor-device fabrication method, a silicon layer and a titanium nitride film are deposited in order on an insulating film having a concave portion so that the concave portion is embedded up to the middle of it and then, a wiring metal film made of copper or a copper alloy is deposited so that the concave portion is completely embedded. In this case, because the titanium nitride film is deposited on the silicon layer by the chemical vapor deposition method using the compound containing titanium, silicon atoms in the silicon layer react with the compound containing titanium and thereby a titanium-nitride-silicide layer is formed. Therefore, because the second semiconductor device of the present invention can be fabricated, it is possible to solve the second problem of the prior art.

Moreover, according to the second semiconductor-device fabrication method, because a silicon layer and a titanium-nitride-silicide layer is present between an insulating film and a titanium nitride film, when the insulating film is a $SiO_2$ film or the like, the adhesiveness between the insulating film and the titanium nitride film is improved compared to the case in which the insulating film directly contacts with the titanium nitride film. Therefore, when forming a via or wiring by removing the portions of the titanium nitride film and the wiring metal film outside the concave portion by, for example, the chemical-mechanical polishing method, it is possible to avoid that exfoliation occurs at the interface between the insulating film and the titanium nitride film, that is, a laminated wiring structure on the semiconductor substrate is broken and thereby, it is possible to prevent the yield of semiconductor devices from lowering. That is, according to the second semiconductor-device fabrication method, it is possible to solve the fourth problem of the prior art.

In the case of the second semiconductor-device fabrication method, it is preferable that the silicon layer is deposited by exposing the surface of the insulating film including the inside of the concave portion to silane.

Thus, it is possible to securely deposit the silicon layer. Moreover, in this case, when exposing the surface to the silane, it is preferable to set the temperature for heating the semiconductor substrate to 350° C. or higher and to set the product of the partial pressure of the silane and the time for exposing the surface to the silane to about $1.33 \times 10^{-2}$ Pa·sec or more. Thus, it is possible to form a silicon layer for forming a titanium-nitride-silicide layer having a thickness large enough to prevent diffusion of copper atoms.

A third semiconductor-device fabrication method of the present invention comprises a step of forming an insulating film having a concave portion on a semiconductor substrate, a step of depositing a metal film, a silicon layer, and a titanium nitride film in order on the insulating film so that the concave portion is embedded up to the middle of it, and a step of depositing a wiring metal film made of copper or a copper alloy on the titanium nitride film so that the concave portion is completely embedded, in which the titanium nitride film is deposited by the chemical vapor deposition method using a compound containing titanium.

According to the third semiconductor-device fabrication method, a metal film, a silicon layer, and a titanium nitride are deposited in order on an insulating film having a concave portion so that the concave portion is embedded up to the middle of it and then, a wiring metal film made of copper or a copper alloy is deposited so that the concave portion is completely embedded. In this case, because the titanium nitride film is deposited on the silicon layer by the chemical vapor deposition method using the compound containing titanium, silicon atoms in the silicon layer reacts with the compound containing titanium and thereby, a titanium-nitride-silicide layer is formed. Therefore, because a third semiconductor device of the present invention can be fabricated, it is possible to solve the second problem of the prior art.

Moreover, according to the third semiconductor-device fabrication method, because a silicon layer is deposited on an insulating film with a metal film interposed between the silicon layer and the insulating film, the insulating film does not directly contact with the silicon layer even if the insulating film is an insulating film of a specific type having an inferior adhesiveness with the silicon layer such as an SiOF film. Therefore, when removing the portions of the titanium nitride film and the wiring metal film outside the concave portion by, for example, the chemical-mechanical polishing method and thereby forming a via or wiring, it is possible to avoid that a laminated wiring structure on the semiconductor substrate is broken and thereby prevent the yield of semiconductor devices from lowering. That is, according to the third semiconductor-device fabrication method, it is possible to solve the fourth problem of the prior art.

In the case of the third semiconductor-device fabrication method, it is preferable that the metal film is another titanium nitride film.

Thus, the power for preventing diffusion of copper atoms is securely improved.

In the case of the third semiconductor-device fabrication method, it is preferable that the silicon layer is deposited by exposing the surface of the metal film including the inside of the concave portion to silane.

Thus, it is possible to securely deposit the silicon layer. Moreover, in this case, to expose the surface to the silane, it is preferable to set the temperature for heating the semiconductor substrate to 350° C. or higher and the product of the partial pressure of the silane and the time for exposing the surface to the silane to about $1.33 \times 10^{-2}$ Pa·sec or more. Thus, it is possible to form a silicon layer for forming a titanium-nitride-silicide layer having a thickness large enough to prevent diffusion of copper atoms.

DETAILED DESCRIPTION OF THE INVENTION

Embodiment 1

Hereafter, the semiconductor device and its fabrication method of the Embodiment 1 of the present invention are described by referring to the accompanying drawings.

FIGS. 1 to 7 are sectional views showing steps of the fabrication method of the semiconductor device of the Embodiment 1.

Figure 7:
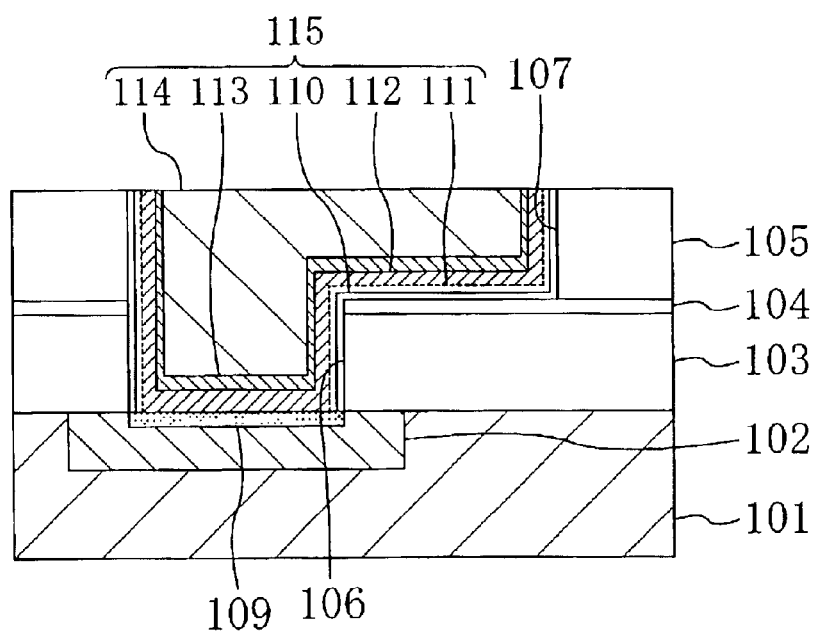
FIG. 7 is a sectional view showing a step of the fabrication method of the semiconductor device of the Embodiment 1 of the present invention.

As shown in FIG. 7, in the case of the semiconductor device of the Embodiment 1, a lower-layer wiring 102 formed by a copper (Cu) film is formed on the surface of a semiconductor substrate 101 and a first silicon dioxide ($SiO_2$) film 103 is formed on the semiconductor substrate 101 and the lower-layer wiring 102 respectively. Moreover, a silicon nitride film ($Si_3N_4$) 104 and a second $SiO_2$ film 105 are formed in order on the first $SiO_2$ 103. A via hole 106 reaching the lower-layer wiring 102 is formed in the first $SiO_2$ film 103 and $Si_3N_4$ film 104, and a wiring groove 107 connecting with the via hole 106 is formed in the second $SiO_2$ film 105. Moreover, a copper silicide $\{CuSix(x>0)\}$ layer 109 is formed in the portion of the lower-layer wiring 102 contacting with the via hole 106.

The surface of the first $SiO_2$ film 103 and the surface of the $Si_3N_4$ film 104 respectively serving as the wall surface of the via hole 106, the surface of the $Si_3N_4$ film 104 serving as the bottom face of the wiring groove 107, and the surface of the second $SiO_2$ film 105 serving as the wall surface of the wiring groove 107 are respectively covered with a silicon (Si) layer 110 and a titanium-nitride-silicide (TiSiN) layer 111. Moreover, a titanium nitride (TiN) film 112 serving as a barrier metal film is formed on the via hole 106 and the wiring groove 107 provided with the Si layer 110 and TiSiN layer 111 and a first Cu film 113 and a second Cu film 114 are formed in order on the TiN film 112 so that the via hole 106 and wiring groove 107 are embedded. In this case, the Si layer 110, TiSiN layer 111, TiN film 112, first Cu film 113, and second Cu film 114 formed in the via hole 106 and wiring groove 107 constitute an upper-layer wiring 115.

Then, the fabrication method of the semiconductor device of the Embodiment 1 is described below by referring to FIGS. 1 to 7.

Figure 1:
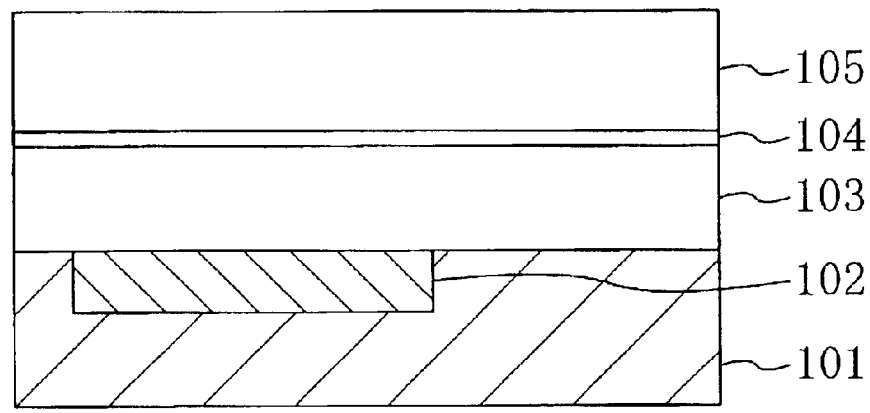
FIG. 1 is a sectional view showing a step of a fabrication method of a semiconductor device of an Embodiment 1 of the present invention.

First, as shown in FIG. 1, a first $SiO_2$ film 103, an $Si_3N_4$ film 104, and a second $SiO_2$ film 105 are formed in order, on a semiconductor substrate 101 provided with a lower-layer wiring 102 formed by a Cu film, by the plasma-excitation-type chemical vapor deposition method.

Figure 2:
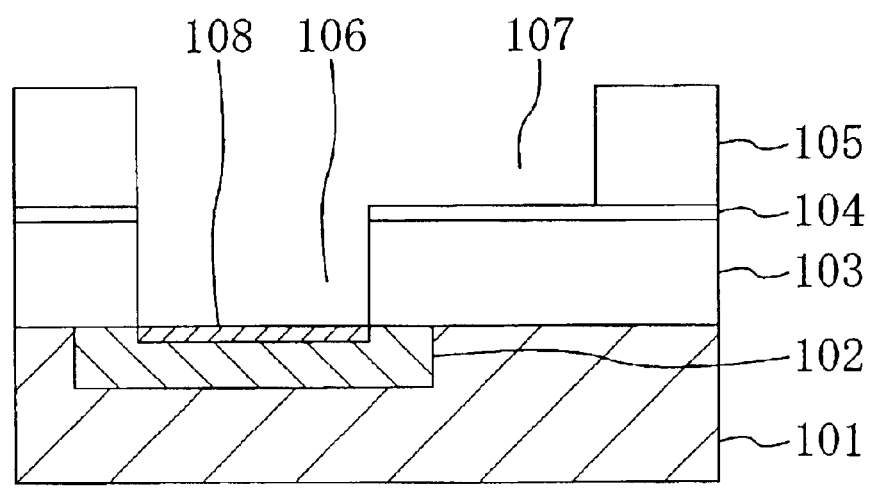
FIG. 2 is a sectional view showing a step of the fabrication method of the semiconductor device of the Embodiment 1 of the present invention.

Then, as shown in FIG. 2, by alternately using the lithography method and the dry etching method twice each, a via hole 106 reaching the lower-layer wiring 102 is formed in the first $SiO_2$ film 103 and $Si_3N_4$ film 104 and a wiring groove 107 connecting with the via hole 106 is formed in the second $SiO_2$ film 105. In this case, a Cu film constituting the lower-layer wiring 102 is exposed to the bottom of the via hole 106 while the surface of the Cu film is usually immediately oxidized by oxygen ($O_2$) in the air. Thereby, a copper oxide $\{CuOx (x>0)\}$ layer 108 is formed in the portion of the lower-layer wiring 102 exposed to the via hole 106.

Figure 3:
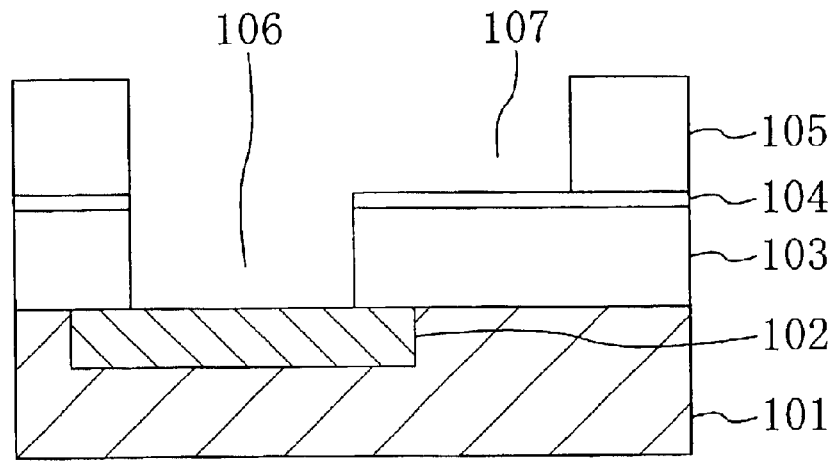
FIG. 3 is a sectional view showing a step of the fabrication method of the semiconductor device of the Embodiment 1 of the present invention.
Figure 4:
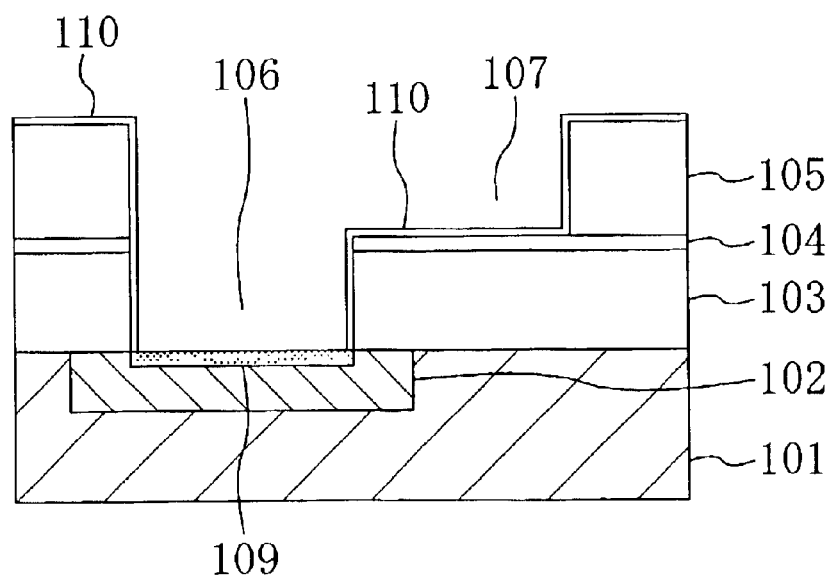
FIG. 4 is a sectional view showing a step of the fabrication method of the semiconductor device of the Embodiment 1 of the present invention.

Then, the semiconductor substrate 101 is introduced into a vacuum chamber (not illustrated) and held for about 15 sec while heating the substrate 101 to about 400° C. at a reduced pressure. Thereby, as shown in FIG. 3, the CuOx layer 108 formed at the bottom of the via hole 106 spontaneously decomposes and thereby, the clean surface of the Cu film is exposed.

Then, while keeping the heating temperature of the semiconductor substrate 101 at about 400° C., 5 sccm of silane ($SiH_4$) and 1,000 sccm of hydrogen ($H_2$) are introduced into the vacuum chamber and then the pressure in the vacuum chamber is controlled to about 133 Pa. In this case, the partial pressure of $SiH_4$ in the vacuum chamber becomes about 0.665 Pa. Then, by holding the semiconductor substrate 101 for 20 sec under the above state, Cu atoms react with $SiH_4$ on the portion (that is, the surface of the Cu film) of the lower-layer wiring 102 exposed to the via hole 106 and a CuSix layer 109 having a thickness of about 5 nm is formed. Moreover, an Si layer 110 having a thickness of about 2 nm is deposited on surfaces of the first $SiO_2$ film 103, $Si_3N_4$ film 104, and second $SiO_2$ film 105 respectively in accordance with the surface decomposition reaction of the surface of the SiH$_4$. That is, the wall surface of the via hole 106 and the wall surface and bottom face of the wiring groove 107 are covered with the Si layer 110 respectively.

Figure 5:
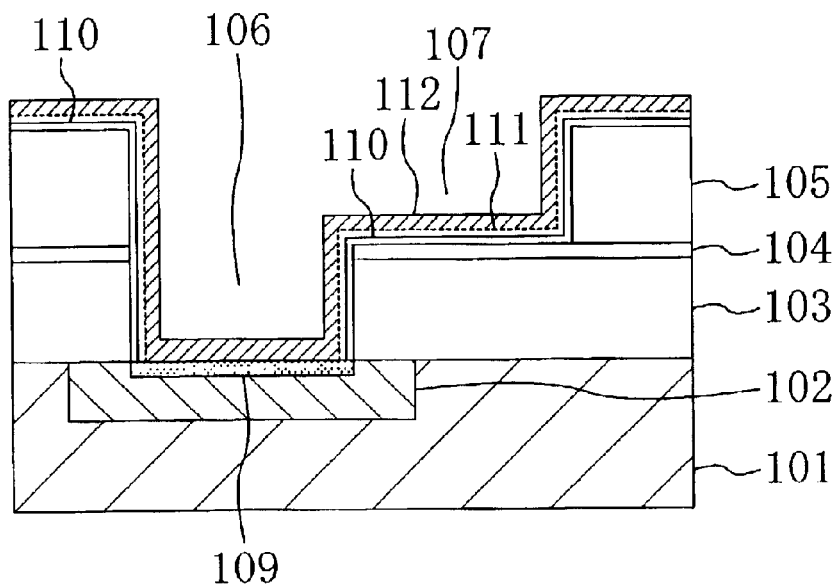
FIG. 5 is a sectional view showing a step of the fabrication method of the semiconductor device of the Embodiment 1 of the present invention.

Then, while keeping the heating temperature of the semiconductor substrate 101 at about 400° C., tetrakisdimethylaminotitanium (TDMAT) diluted by helium (He) is introduced into the vacuum chamber. In this case, the condition for introducing TDMAT or the pressure in the vacuum chamber is adjusted so that the partial pressure of TDMAT in the vacuum chamber becomes about 0.665 Pa. Then, by keeping the semiconductor substrate 101 for 20 sec under the above state, the TiN film 112 having a thickness of about 10 nm is formed on the CuSix layer 109 as shown in FIG. 5. Moreover, on the surface of the Si layer 110, Si atoms in the Si layer 110 react with TDMAT and thereby a TiSiN layer 111 having a thickness of about 2 nm is formed as the first stage and the thickness of the Si layer 110 is decreased from about 2 nm to about 1 nm. Then, as the second stage, the above TiN film 112 is formed on the TiSiN layer 111 at a thickness of about 8 nm.

Figure 6:
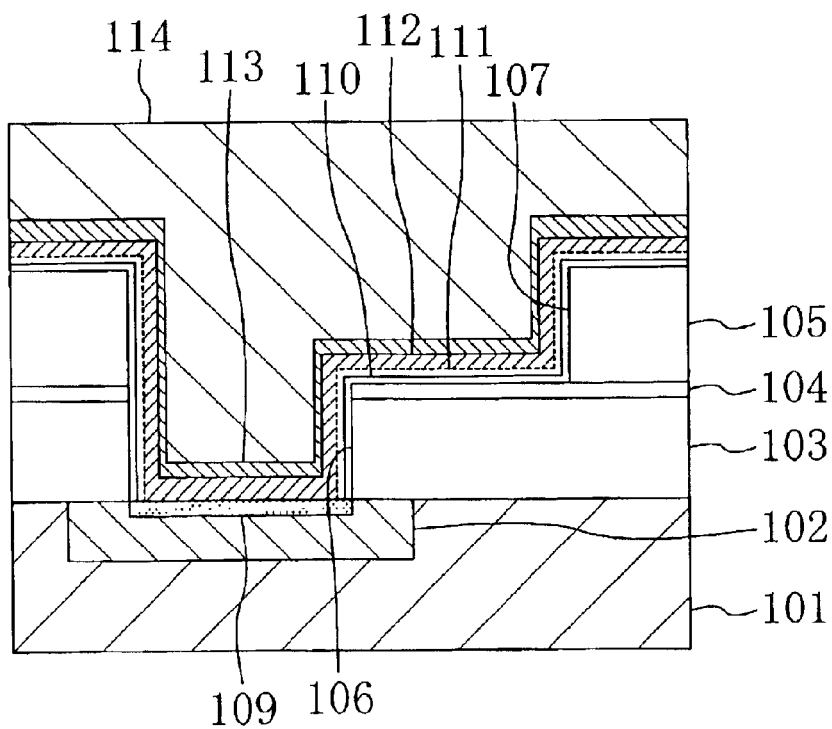
FIG. 6 is a sectional view showing a step of the fabrication method of the semiconductor device of the Embodiment 1 of the present invention.

Then, as shown in FIG. 6, a first Cu film 113 is formed on the TiN film 112 by, for example, the physical vapor deposition method and then and a second Cu film 114 is formed on the first Cu film 113 by the plating method to embed the via hole 106 and wiring groove 107.

Finally, as shown in FIG. 7, the portions of the Si layer 110, TiSiN layer 111, TiN film 112, first Cu film 113, and second Cu film 114 outside the wiring groove 107 are removed by the chemical vapor deposition method (CMP method). Thereby, an upper-layer wiring 115 constituted by the Si layer 110, TiSiN layer 111, TiN film 112, first Cu film 113, and second Cu film 114 embedded in the via hole 106 and wiring groove 107 is formed.

Figure 27:
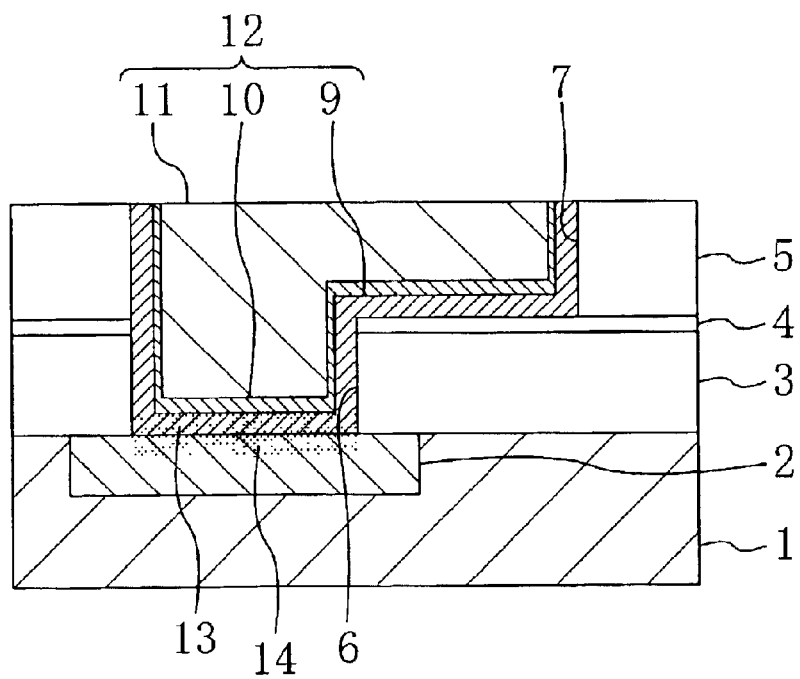
FIG. 27 is an illustration for explaining problems of the prior art.

According to the Embodiment 1, it is possible to solve the first problem of the prior art (refer to FIG. 27), that is, prevent the phenomenon that when operating a semiconductor device for a long time at a high temperature, the connection resistance between a lower-layer wiring and an upper-layer wiring increases. The reason is described below. That is, in the case of the Embodiment 1, the portion of the lower-layer wiring 102 contacting with the TiN film 112 in the via hole 106 is the CuSix layer 109. In other words, the CuSix layer 109 is present between a Cu film constituting the lower-layer wiring 102 and the TiN film 112. Oxygen atoms implanted into the Cu film constituting the lower-layer wiring 102 under the dry etching for forming the via hole 106 move in the grain boundary in the Cu film. However, when the CuSix layer 109 having a crystal structure different from that of a Cu film is present between the Cu film and the TiN film 112, the grain boundary in the Cu film terminates without reaching the TiN film 112. Therefore, it is possible to prevent oxygen atoms implanted into the Cu film constituting the lower-layer wiring 102 from reaching the TiN film 112 and thereby, a high-resistance titanium oxide (TiOx) layer is not formed in the portion of the TiN film 112 contacting with the lower-layer wiring 102. Therefore, even when operating a semiconductor device for a long time at a high temperature, it is possible to avoid that the connection resistance between the lower-layer wiring 102 and the upper-layer wiring 115 increases and thereby, prevent the operation speed of the semiconductor device from lowering.

Figure 28:
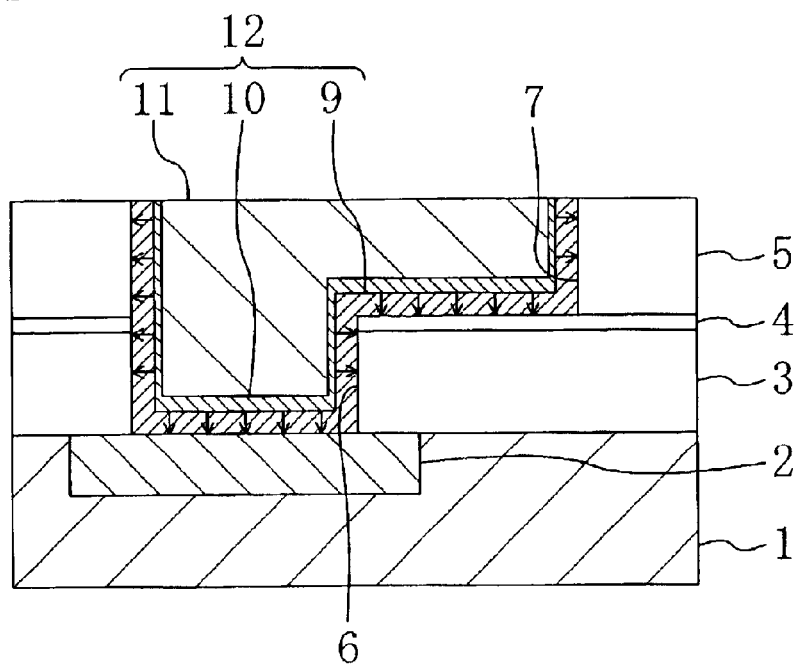
FIG. 28 is an illustration for explaining problems of the prior art.

Moreover, according to the Embodiment 1, it is possible to solve the second problem of the prior art (refer to FIG. 28), that is, prevent the phenomenon that when operating a semiconductor device for a long time at a high temperature, the leak current between adjacent vias or wirings increases.

The reason is described below. That is, in the case of the Embodiment 1, wall surfaces of the via hole 106 and wiring groove 107 are respectively covered with the TiSiN layer 111. In this case, because Si contained in the TiSiN layer has Si—N bonds having a very low reactivity with Cu atoms, the TiSiN layer has the power for preventing diffusion of Cu atoms higher than that of the TiN film.

Therefore, Cu atoms constituting the first Cu film 113 and second Cu film 114 do not easily reach the first SiO$_2$ film 103 or second SiO$_2$ film 105 and thereby, the concentration of Cu atoms contained in the first SiO$_2$ film 103 and second SiO$_2$ film 105 is lowered. Therefore, even when operating a semiconductor device for a long time at a high temperature, it is possible to avoid that the leak current between vias or wirings (that is, upper-layer wirings 115) increases, and thereby prevent the semiconductor device from malfunctioning.

Figure 8:
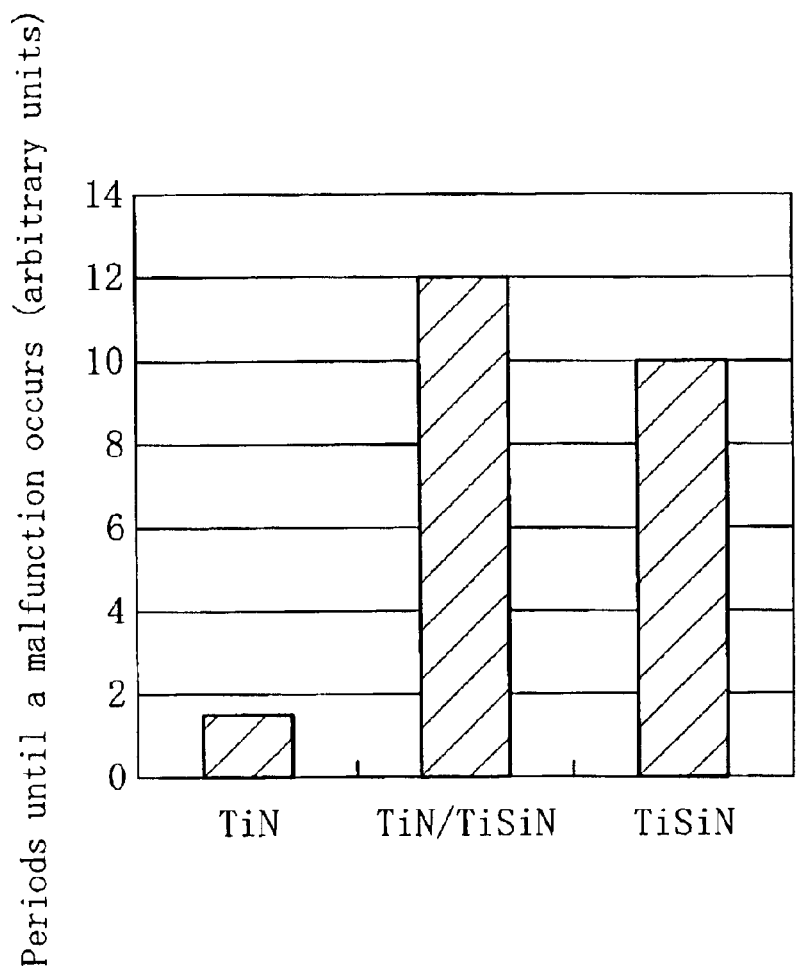
FIG. 8 is an illustration showing a result of comparing periods until a malfunction occurs in a semiconductor device after a leak current is increased due to diffusion of Cu atoms when using a single-layer structure of only a TiN film, a laminated structure of a TiSiN layer and a TiN film, and a single-layer structure of only a TiSiN layer.

Furthermore, according to the Embodiment 1, the effect for preventing a leak current from increasing is further improved by a structure in which the TiN film 112 is formed so as to contact the surface of the TiSiN layer 111. FIG. 8 shows an experiment result for supporting the above effect. FIG. 8 shows a result of comparing periods until a malfunction of a semiconductor device occurs after a leak current is increased due to diffusion of Cu atoms when using a single-layer structure (thickness of 10 nm) of only a TiN film, a laminated structure of a TiSiN layer and the TiN film (total thickness of 10 nm), and a single-layer structure (thickness of 10 nm) of only a TiSiN layer respectively. As shown in FIG. 8, the period until a malfunction occurs in the semiconductor device is the longest when using the laminated structure of the TiSiN layer and the TiN film. This represents that the laminated structure of the TiSiN layer and the TiN film is particularly effective to prevent Cu atoms from diffusing.

Figure 29:
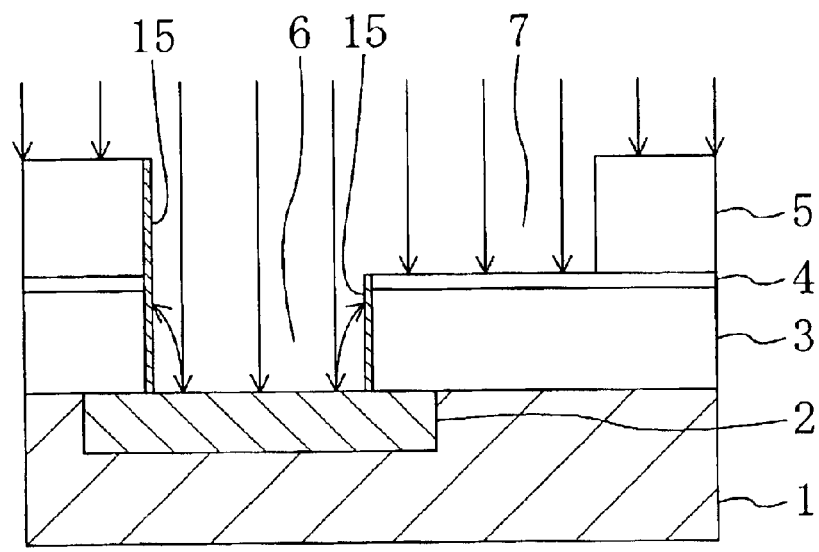
FIG. 29 is an illustration for explaining problems of the prior art.

Furthermore, according to the Embodiment 1, it is possible to solve the third problem (refer to FIG. 29) of the prior art, that is, prevent the phenomenon that vias or wirings are unexpectedly electrically connected each other due to attachment of Cu to the wall surface of a via hole or wring groove and thereby, the yield of semiconductor devices is extremely lowered. The reason is described below. That is, in the case of the Embodiment 1, removal of the CuOx layer 108 formed, when forming the via hole 106, in the portion of the lower-layer wiring 102 exposed to the via hole 106, that is, cleaning of the bottom of the via hole 106 is executed by using a method of holding the semiconductor substrate 101 at a high temperature under a reduced pressure and a method of making Cu atoms in the portion of the lower-layer wiring 102 exposed to the via hole 106 react with SiH$_4$ to form the CuSix layer 109. In other words, cleaning of the bottom of the via hole 106 can be performed by only a chemical method instead of the conventional sputter etching method. Therefore, it is possible to avoid that Cu atoms contained in the lower-layer wiring 102 are scattered and attach to the wall surface of the via hole 106 or wiring groove 107 and then, reach the first SiO$_2$ film 103 or second SiO$_2$ film 105. Therefore, because upper-layer wirings 115 adjacent to each other are not unexpectedly electrically connected, it is possible to prevent the yield of semiconductor devices from lowering.

Figure 30:
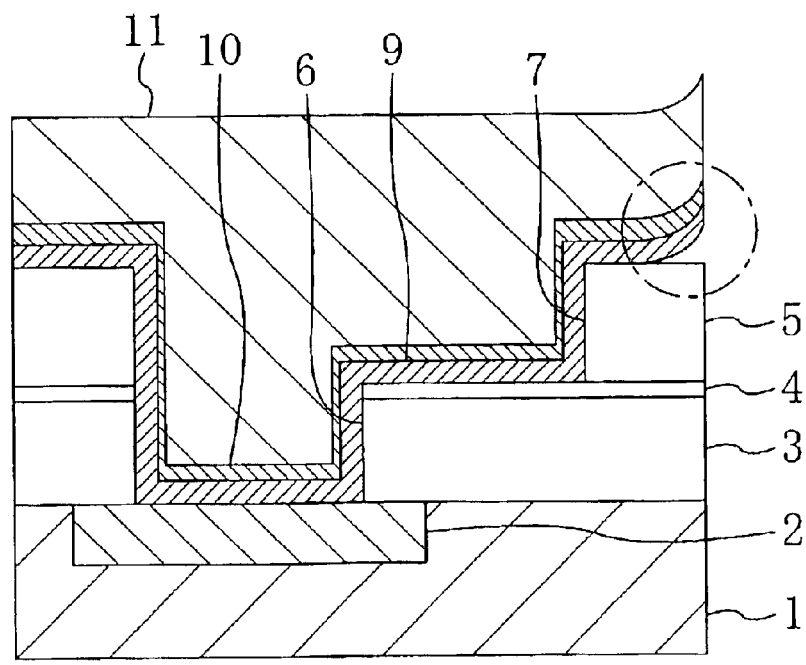
FIG. 30 is an illustration for explaining problems of the prior art.

Furthermore, according to the Embodiment 1, it is possible to solve the fourth problem (refer to FIG. 30) of the prior art, that is, prevent the phenomenon that when removing the portion of each of a TiN film and Cu film outside the wiring groove, exfoliation occurs at the interface between an inter-layer insulating film provided with a wiring groove and the TiN film and thereby the yield of semiconductor devices is extremely lowered. The reason is described below. That is, in the case of the Embodiment 1, because the Si layer 110 and TiSiN layer 111 are present between the second $SiO_2$ layer 105 provided with the wiring groove 107 and the TiN film 112, the adhesiveness between the second $SiO_2$ film 105 and TiN film 112 is improved compared to the case in which the second $SiO_2$ film 105 directly contacts with the TiN film 112. Therefore, when removing the portions of the TiN film 112 and the first and second Cu films 113 and 114 outside the wiring groove 107 by, for example, the CMP method to form the upper-layer wiring 115, it is possible to avoid that exfoliation occurs at the interface between the second $SiO_2$ film 105 and the TiN film 112, that is, prevent that the laminated wiring structure on the semiconductor substrate 101 is broken and thereby, prevent the yield of semiconductor devices from lowering.

In the case of the Embodiment 1, it is preferable that the thickness of the CuSix layer 109 is set to a value between 0.5 nm and 20 nm (both included). This is because when the thickness of the CuSix layer 109 becomes smaller than 0.5 nm, the power for preventing oxygen atoms from moving becomes insufficient and moreover, when the thickness of the CuSix layer 109 becomes larger than 20 nm, the connection resistance between the lower-layer wiring 102 and the upper-layer wiring 115 increases due to the resistivity of the CuSix layer 109.

Moreover, in the case of the Embodiment 1, it is preferable that the thickness of the TiSiN layer 111 is set to a value between 0.5 nm and 10 nm (both included). This is because when the thickness of the TiSiN layer 111 becomes smaller than 0.5 nm, the power for preventing Cu atoms from diffusing becomes insufficient and when the thickness of the TiSiN layer 111 becomes larger than 10 nm, thicknesses of the first and second Cu films 113 and 114 embedded in the via hole 106 and wiring groove 107 decrease and thereby the resistance of the upper-layer wiring 115 increases. Moreover, because of the same reason, it is preferable that the thickness of the TiN film 112 is also set to a value between 0.5 nm and 10 nm (both included) and the total thickness of the TiSiN layer 111 and TiN film 112 is set to a value between 1 nm and 20 nm (both included).

Furthermore, in the case of the Embodiment 1, a step of holding the semiconductor substrate 101 while heating it at a reduced pressure (refer to FIG. 3) is executed to accelerate a uniform formation of the CuSix layer 109 by decomposing the CuOx layer 108 formed at the bottom of the via hole 106. Therefore, it is allowed to omit the step when the thickness of the CuOx layer 108 is sufficiently small. Moreover, it is preferable that the step is executed in a state in which the partial pressure of $O_2$ in a vacuum chamber is about $1.33\times10^{-4}$ Pa or lower. This is because when the partial pressure of $O_2$ in the vacuum chamber becomes higher than about $1.33\times10^{-4}$ Pa, the speed at which the surface of a Cu film constituting the lower-layer wiring 102 is oxidized by $O_2$ becomes larger than the speed at which the CuOx layer 108 is decomposed and thereby, the surface of the Cu film cannot be cleaned. Moreover, in the above step, it is preferable that the temperature for heating the semiconductor substrate 101 is set to about 300° C. or higher. This is because when the temperature for heating the semiconductor substrate 101 is set to a value lower than about 300° C., the speed at which the CuOx layer 108 is decomposed is greatly lowered and resultantly, the surface of a Cu film constituting the lower-layer wiring 102 cannot be cleaned. Moreover, it is preferable that the period for holding the semiconductor substrate 101 while heating it in the above step is set to about 3 sec or more. This is because when a substrate-heating period of at least about 3 sec is required for the CuOx layer 108 to decompose and thereby the surface of a clean Cu film to appear on the lower-layer wiring 102.

Moreover, in the case of the Embodiment 1, it is preferable to set the heating temperature of the semiconductor substrate 101 to 350° C. or higher in a step of introducing $SiH_4$ into a vacuum chamber and thereby forming the CuSix layer 109 and depositing the Si layer 110. This is because when setting the heating temperature of the semiconductor substrate 101 to a value lower than 350° C., the speed of the surface decomposition reaction of the $SiH_4$ extremely lowers and thereby, the Si layer 110 is not deposited. Moreover, in the above step, when assuming the partial pressure of $SiH_4$ in a vacuum chamber as P (Pa) and the period for introducing $SiH_4$ into the vacuum chamber as t (sec), it is preferable to set P and t so that the product P·t of P and t ranges between about $1.33\times10^{-2}$ and $6.65\times10$ Pa·sec (both included). This is because when the value of P·t becomes smaller than about $1.33\times10^{-2}$ Pa·sec, the thickness of the Si layer 110 becomes insufficient and thereby it is impossible to form the TiSiN layer 111 having a thickness large enough to prevent Cu atoms from diffusing and when the value of P·t becomes larger than about $6.65\times10$ Pa·sec, the thickness of the CuSix layer 109 becomes excessive and the connection resistance between the lower-layer wiring 102 and the upper-layer wiring 115 increases.

Embodiment 2

The semiconductor device of the Embodiment 2 of the present invention and its fabrication method are described below by referring to the accompanying drawings.

FIGS. 9 to 17 are sectional views showing steps of the fabrication method of the semiconductor device of the Embodiment 2. In FIGS. 9 to 17, the same member as that of the Embodiment 1 shown in FIGS. 1 to 7 is provided with the same symbol and its description may be omitted.

Figure 17:
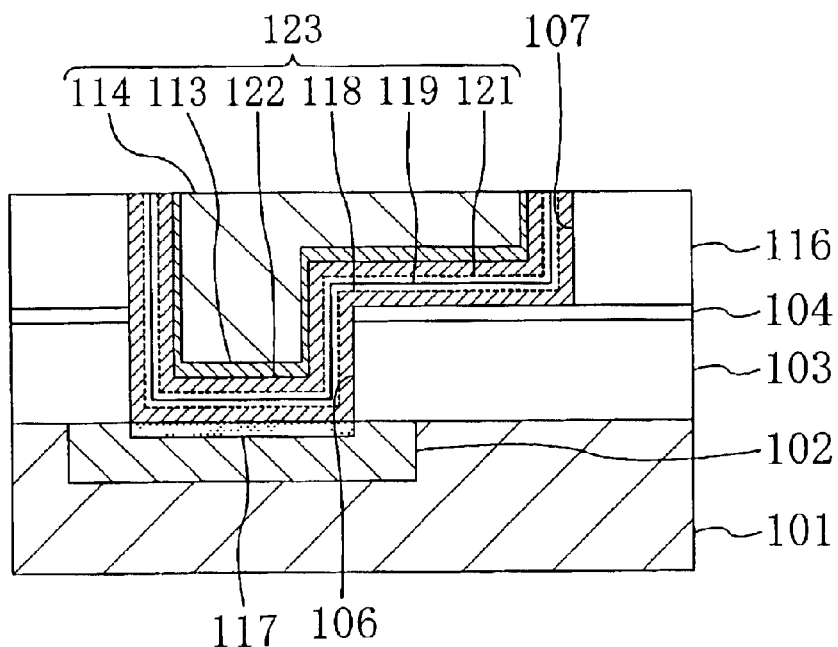
FIG. 17 is a sectional view showing a step of the fabrication method of the semiconductor device of the Embodiment 2 of the present invention.

In the case of the semiconductor device of the Embodiment 2, as sown in FIG. 17, a lower-layer wiring 102 made of a Cu film is formed on the surface of a semiconductor substrate 101 and a first $SiO_2$ film 103 is formed on the semiconductor substrate 101 and lower-layer wiring 102 respectively. Moreover, an $Si_3N_4$ film 104 and a second $SiO_2$ film (hereafter referred to as an SiOF film) 116 containing fluorine are formed in order on the first $SiO_2$ film 103.

A via hole 106 reaching the lower-layer wiring 102 is formed in the first $SiO_2$ film 103 and $Si_3N_4$ film 104 and a wiring groove 107 connecting with the via hole 106 is formed in the SiOF film 116. Moreover, a copper silicide {CuSix(x>0)} layer 117 is formed in the portion of the lower-layer wiring 102 contacting with the via hole 106.

A first TiN film 118 serving as a barrier metal film is formed on the surface of the CuSix layer 117 serving as the bottom face of the via hole 106, the surfaces of the first $SiO_2$ film 103 and $Si_3N_4$ film 104 serving as the wall surface of the via hole 106, the surface of the $Si_3N_4$ film 104 serving as the bottom face of the wiring groove 107, and the surface of the SiOF film 116 serving as the wall surface of the wiring groove 107. Moreover, a second TiN film 122 serving as a barrier metal film is formed on the first TiN film 118 with a first TiSiN layer 119 and a second TiSiN layer 121 interposed between the first TiN film 118 and the second TiN film 122, and a first Cu film 113 and a second Cu film 114 are formed on the second TiN film 122 so that the via hole 106 and wiring groove 107 are embedded. In this case, a first TiN film 118, first TiSiN layer 119, second TiSiN layer 121, second TiN film 122, first Cu film 113, and second Cu film 114 formed in the via hole 106 and the wiring groove 107 constitute an upper-layer wiring 123.

As to be described later in detail, the first TiSiN layer 119 and the second TiSiN layer 121 are called separately from each other for convenience's sake in accordance with the difference between forming methods in this embodiment but it is not a constitutive requirement of the present invention that the TiSiN layers are individually formed.

When using an SiOF film as an inter-layer insulating film the same as the case of this embodiment, the configuration is not preferable in which an Si layer is deposited so as to contact with the surface of the inter-layer insulating film the same as the case of the Embodiment 1. The reason is described below. That is, when depositing an Si layer so as to contact with the surface of an SiOF film, some of Si atoms become silicon fluoride {SiFx(x>0)} and desorb. Therefore, the adhesiveness between the SiOF film and the Si layer is extremely deteriorated and resultantly, exfoliation easily occurs at the interface between the SiOF film and Si layer when applying the CMP method.

Therefore, in the case of this embodiment, the following method is executed instead of depositing an Si layer so as to contact with the surface of the SiOF film 116. That is, the first TiN film 118 is formed so as to contact with the surface of the SiOF film 116 and then, the first TiSiN layer 119 is formed on the surface of the first TiN film 118 and then, an Si layer 120 is deposited on the first TiSiN layer 119 (refer to FIG. 14). Then, the Si layer 120 is made to react with TDMAT to form the second TiSiN layer 121 (refer to FIG. 15) so that Cu atoms can be prevented from diffusing to the first $SiO_2$ film 103 and SiOF film 116 without the occurrence of peeling during the CMP process.

The fabrication method of the semiconductor device of the Embodiment 2 is described below in detail by referring to FIGS. 9 to 17.

Figure 9:
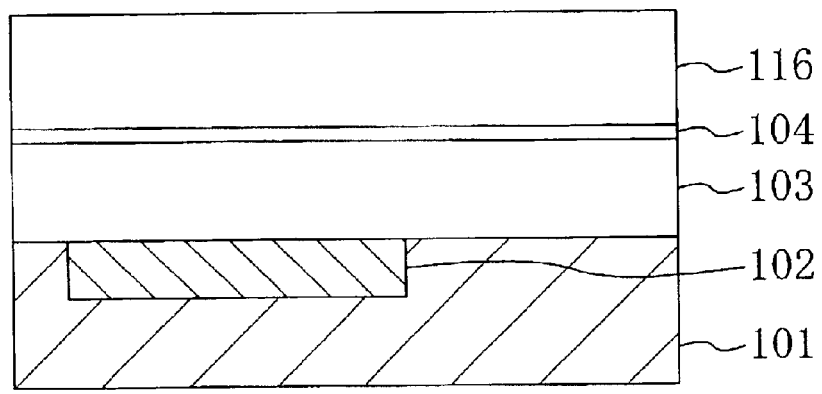
FIG. 9 is a sectional view showing a step of a fabrication method of a semiconductor device of an Embodiment 2 of the present invention.

First, as shown in FIG. 9, the first $SiO_2$ film 103, $Si_3N_4$ film 104, and SiOF film 116 are formed in order on the semiconductor substrate 101, on which the lower-layer wiring 102 made of a Cu film is formed, by the plasma-excitation-type chemical vapor deposition method.

Figure 10:
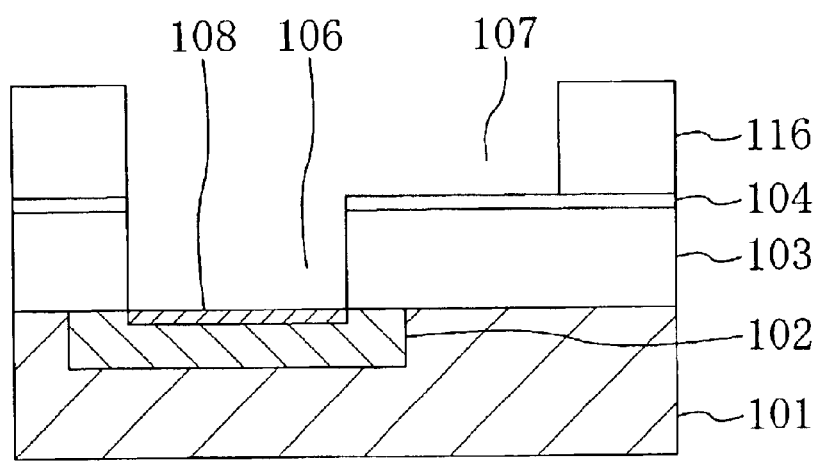
FIG. 10 is a sectional view showing a step of the fabrication method of the semiconductor device of the Embodiment 2 of the present invention.

Then, as shown in FIG. 10, by alternately using the lithography method and dry etching method twice each, the via hole 106 reaching the lower-layer wiring 102 is formed in the first $SiO_2$ film 103 and the $Si_3N_4$ film 104 and the wiring groove 107 connecting with the via hole 106 is formed in the SiOF film 116. In this case, a Cu film constituting the lower-layer wiring 102 is exposed to the bottom of the via hole 106 while the surface of the Cu film is usually immediately oxidized by $O_2$ in the air. Thereby, the CuOx (x>0) layer 108 is formed in the portion of the lower-layer wiring 102 exposed to the via hole 106.

Figure 11:
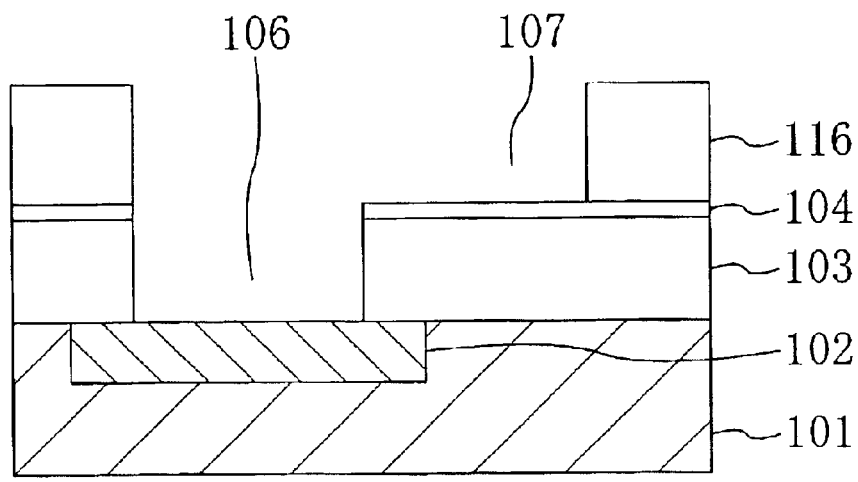
FIG. 11 is a sectional view showing a step of the fabrication method of the semiconductor device of the Embodiment 2 of the present invention.

Then, the semiconductor substrate 101 is introduced into a vacuum chamber (not illustrated) and held for about 15 sec while heating the substrate 101 to about 400° C. at a reduced pressure. Thereby, as shown in FIG. 11, the CuOx layer 108 formed at the bottom of the via hole 106 spontaneously decomposes and thereby, the surface of the clean Cu film is exposed.

Figure 12:
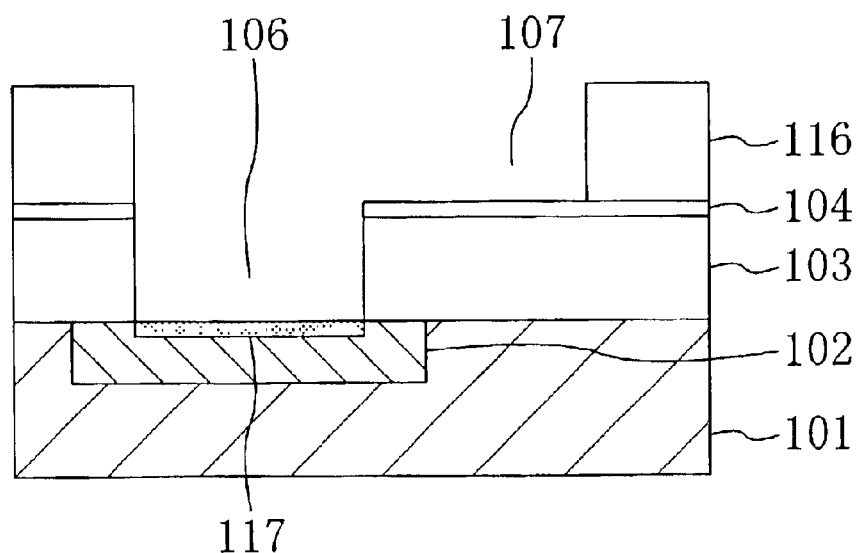
FIG. 12 is a sectional view showing a step of the fabrication method of the semiconductor device of the Embodiment 2 of the present invention.

Then, the heating temperature of the semiconductor substrate 101 is lowered to about 300° C. and then, 20 sccm of $SiH_4$ and 1,000 sccm of $H_2$ are introduced into a vacuum chamber and the pressure in the vacuum chamber is controlled to about 66.5 Pa. Then, by holding the semiconductor substrate 101 for 50 sec under the above state, Cu atoms react with $SiH_4$ at the portion of the lower-layer wiring 102 exposed to the via hole 106 and thereby, as shown in FIG. 12, the CuSix layer 117 having a thickness of about 2.5 nm is formed. However, differently from the case of the Embodiment 1, an Si layer is not deposited on the surfaces of the first $SiO_2$ film 103, $Si_3N_4$ film 104, and SiOF film 116, that is, the wall surface of the via hole 106 and the wall surface and bottom face of the wiring groove 107. This is because when setting the substrate heating temperature to a low value of 300° C., the speed of the surface decomposition reaction of the surface of $SiH_4$ is extremely lowered.

Figure 13:
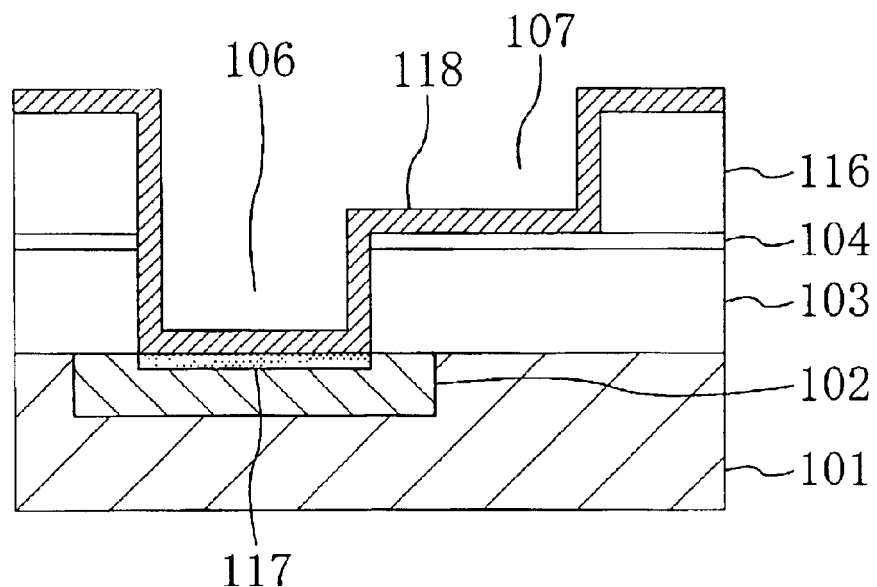
FIG. 13 is a sectional view showing a step of the fabrication method of the semiconductor device of the Embodiment 2 of the present invention.

Then, the heating temperature of the semiconductor substrate 101 is raised to about 400° C. and then TDMAT diluted by He is introduced into the vacuum chamber. In this case, the condition for introducing TDMAT or the pressure in the vacuum chamber is adjusted so that the partial pressure of TDMAT in the vacuum chamber becomes about 0.665 Pa. Then, by holding the semiconductor substrate 101 for 10 sec under the above state, the first TiN film 118 having a thickness of about 5 nm is formed on the SiOF film 116 including the via hole 106 and the wiring groove 107 as shown in FIG. 13. That is, the surface of the CuSix layer 117 serving as the bottom face of the via hole 106, surfaces of the first $SiO_2$ film 103 and the $Si_3N_4$ film 104 serving as the wall surface of the via hole 106, the surface of the $Si_3N_4$ film 104 serving as the bottom face of the wiring groove 107, and the surface of the SiOF film 116 serving as the wall surface of the wiring groove 107 are covered with the first TiN film 118.

Figure 14:
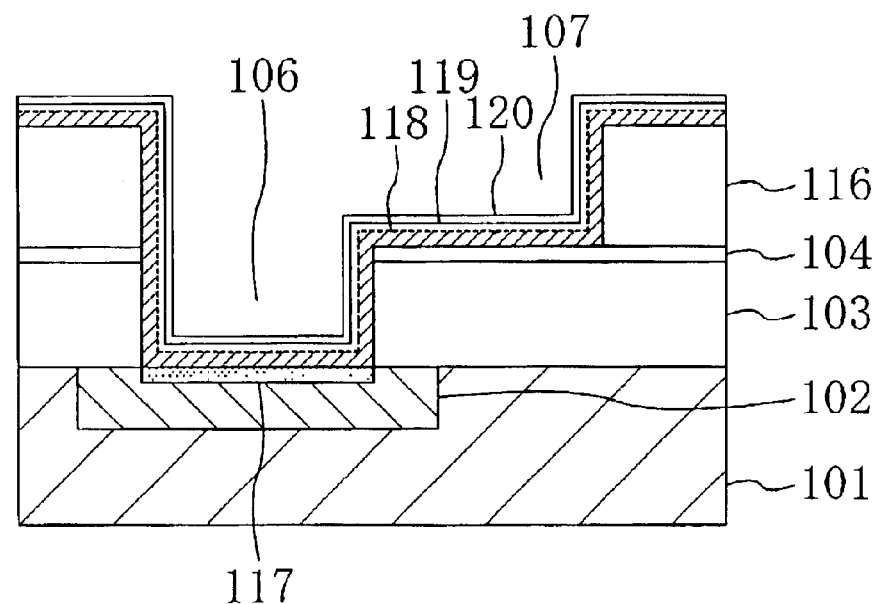
FIG. 14 is a sectional view showing a step of the fabrication method of the semiconductor device of the Embodiment 2 of the present invention.

Then, 5 sccm of $SiH_4$ and 1,000 sccm of $H_2$ are introduced into the vacuum chamber while keeping the heating temperature of the semiconductor substrate 101 at about 400° C. and the pressure in the vacuum chamber is controlled to about 133 Pa. Then, by holding the semiconductor substrate 101 for 20 sec under the above state, $SiH_4$ is diffused in the first TiN film 118 and thereby, the first TiSiN layer 119 having a thickness of about 2 nm is formed in the surface portion of the first TiN film 118 as the first stage as shown in FIG. 14. Then, as the second stage, the Si layer 120 having a thickness of about 1 nm is deposited on the first TiSiN layer 119.

Figure 15:
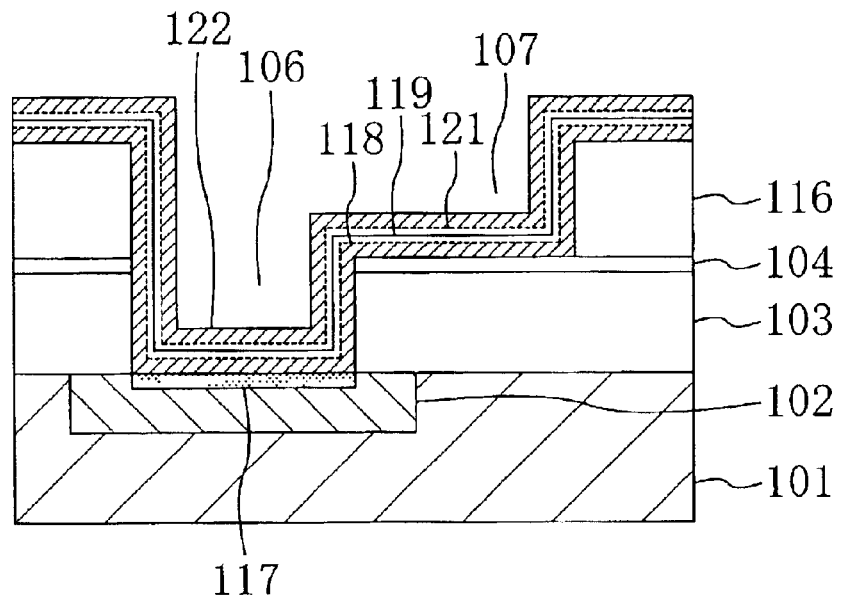
FIG. 15 is a sectional view showing a step of the fabrication method of the semiconductor device of the Embodiment 2 of the present invention.

Then, TDMAT diluted by He is introduced into the vacuum chamber while keeping the heating temperature of the semiconductor substrate 101 at about 400° C. In this case, the condition for introducing TDMAT or the pressure in the vacuum chamber is adjusted so that the partial pressure of TDMAT in the vacuum chamber becomes about 0.665 Pa. Then, by holding the semiconductor substrate 101 for 10 sec under the above state, Si atoms in the Si layer 120 react with TDMAT and thereby the second TiSiN layer 121 having a thickness of about 2 nm is formed as the first stage as shown in FIG. 15. Then, as the second stage, the second TiN film 122 having a thickness of 3 nm is formed on the second TiSiN layer 121.

Figure 16:
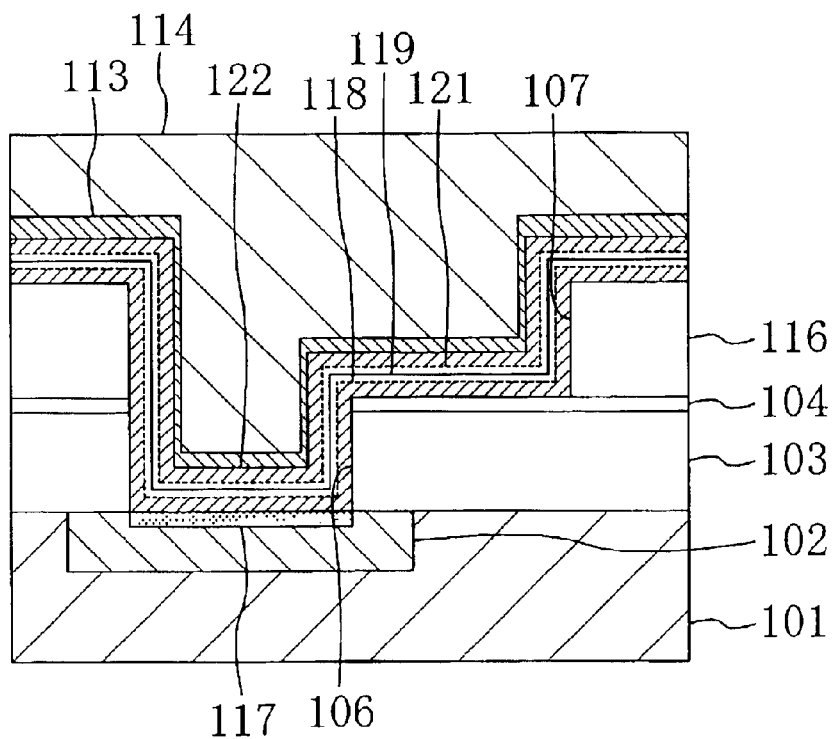
FIG. 16 is a sectional view showing a step of the fabrication method of the semiconductor device of the Embodiment 2 of the present invention.

Then as shown in FIG. 16, the first Cu film 113 is formed on the second TiN film 122 by, for example, the physical vapor deposition method and then the second Cu film 114 is formed on the first Cu film 113 by, for example, the plating method to embed the via hole 106 and wiring groove 107.

Finally, as shown in FIG. 17, the portion of each of the first TiN film 118, first TiSiN layer 119, second TiSiN layer 121, second TiN film 122, first Cu film 113, and second Cu film 114 outside the wiring groove 107 is removed by the CMP method. Thereby, the upper-layer wiring 123 constituted by the first TiN film 118, first TiSiN layer 119, second TiSiN layer 121, second TiN film 122, first Cu film 113, and second Cu film 114 embedded in the via hole 106 and wiring groove 107 is formed.

According to the Embodiment 2, it is possible to solve the first problem (refer to FIG. 27) of the prior art, that is, prevent the phenomenon that when operating a semiconductor device for a long time at a higher temperature, the connection resistance between a lower-layer wiring and an upper-layer wiring increases. The reason is described below. That is, in the case of the Embodiment 2, the portion of the lower-layer wiring 102 contacting with the first TiN film 118 in the via hole 106 is the CuSix layer 117. In other words, the CuSix layer 117 is present between the Cu film constituting the lower-layer wiring 102 and the first TiN film 118. Oxygen atoms implanted into the Cu film constituting the lower-layer wiring 102 under the dry etching for forming the via hole 106 move on the grain boundary in the Cu film. However, when the Cu Six layer 117 different from the Cu film in crystal structure is present between the Cu film and the first TiN film 118, the grain boundary in the Cu film terminates without reaching the first TiN film 118. Therefore, it is possible to prevent the oxygen atoms implanted into the Cu film constituting the lower-layer wiring 102 from reaching the first TiN film 118 and thereby, a high-resistance titanium oxide (TiOx) layer is not formed in the portion of the first TiN film 118 contacting with the lower-layer wiring 102. Therefore, even when operating a semiconductor device for a long time at a high temperature, it is possible to avoid that the connection resistance between the lower-layer wiring 102 and upper-layer wiring 123 increases and thereby, prevent the operation speed of the semiconductor device from lowering.

Moreover, according to the Embodiment 2, it is possible to solve the second problem (refer to FIG. 28) of the prior art, that is, prevent the phenomenon that when operating a semiconductor device for a long time at a high temperature, the leak current between adjacent vias or wirings increases. The reason is described below. That is, in the case of the Embodiment 2, wall surfaces of the via hole 106 and wiring groove 107 are covered with the first and second TiSiN layers 119 and 121 interposing the first TiN film 118 therebetween. In this case, because Si contained in a TiSiN layer has Si-N bonds whose reactivity with Cu atoms is very low, the TiSiN layer has a high power for preventing Cu atoms from diffusing compared to the TiN film. Therefore, Cu atoms constituting the first Cu film 113 and second Cu film 114 cannot easily reach the first $SiO_2$ film 103 or SiOF film 116 and thereby, the concentration of Cu atoms contained in the first $SiO_2$ film 103 and SiOF film 116 lowers. Therefore, even when operating a semiconductor device for a long time at a high temperature, it is possible to avoid that the leak current between adjacent vias or wirings (that is, between upper-layer wirings 123) increases and thereby, prevent malfunctions of the semiconductor device.

Figure 18:
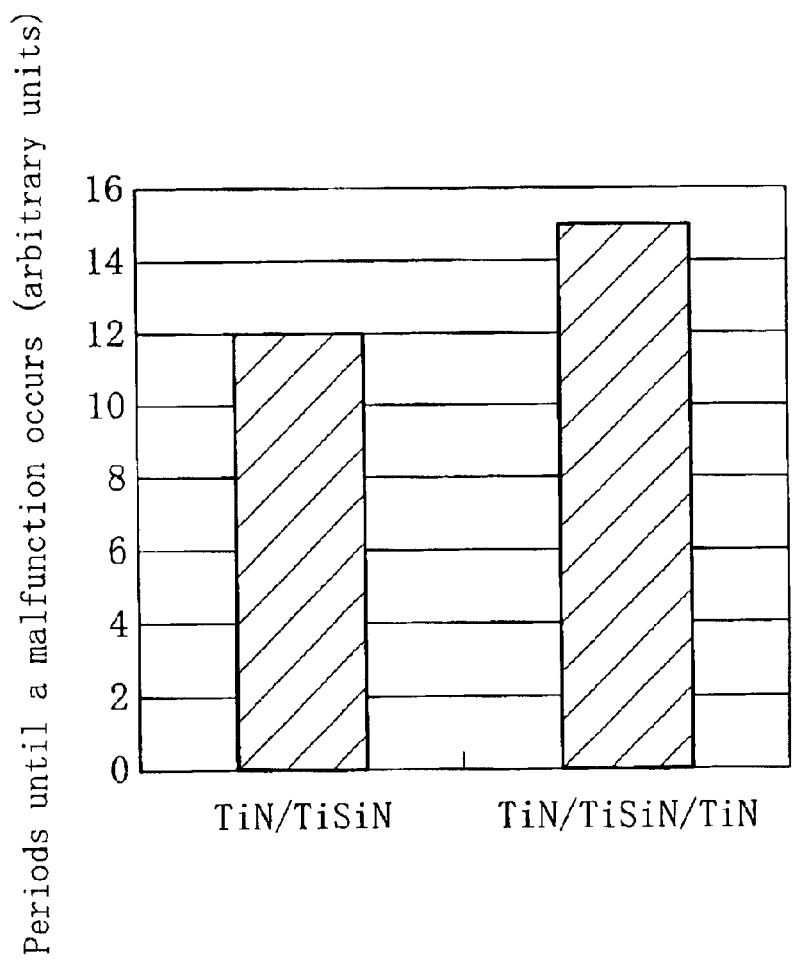
FIG. 18 is an illustration showing a result of comparing periods until a malfunction occurs in a semiconductor device after a leak current is increased due to diffusion of Cu atoms when using a laminated structure of a TiSiN layer and a TiN film and a laminated structure of a TiN film, a TiSiN layer, and a TiN film.

Furthermore, according to the Embodiment 2, the effect for preventing a leak current from increasing is further improved by the structure in which the first TiSiN layer 119 and second TiSiN layer 121 are formed so as to contact with the surface of the first TiN film 118 and the second TiN film 122 is formed so as to contact with the surface of the second TiSiN layer 121. FIG. 18 shows experiment results for supporting the above effect. FIG. 18 shows a result of comparing the period until a malfunction occurs in a semiconductor device after a leak current is increased due to diffusion of Cu atoms when using the laminated structure of a TiSiN layer and a TiN film (total thickness of 10 nm) and the laminated structure of a TiN film, TiSiN layer, and TiN film (total thickness of 10 nm). As shown in FIG. 18, the period until a malfunction occurs in the semiconductor device is longer when using the laminated structure of the TiN film, TiSiN layer, and TiN film. This represents that the laminated structure of the TiN film, TiSiN layer, and TiN film is more effective to prevent Cu atoms from diffusing.

Furthermore, according to the Embodiment 2, it is possible to solve the third problem (refer to FIG. 29) of the prior art, that is, prevent the phenomenon that the yield of semiconductor devices is extremely lowered because vias or wirings are unexpectedly electrically connected each other due to attachment of Cu to wall surfaces of the via holes or wiring grooves. The reason is described below. That is, in the case of the Embodiment 2, removal of the CuOx layer 108 formed, when forming the via hole 106, in the portion of the lower-layer wiring 102 exposed to the via hole 106, that is, cleaning of the bottom of the via hole 106 is executed by the method of holding the semiconductor substrate 101 at a high temperature under a reduced pressure and a method of making Cu atoms in the portion of the lower-layer wiring 102 exposed to the via hole 106 react with $SiH_4$ to form the CuSix layer 117. In other words, the bottom of the via hole 106 can be cleaned by only a chemical method instead of the conventional sputter-etching method. Therefore, it is possible to avoid that Cu atoms contained in the lower-layer wiring 102 are scattered and attach to the wall surface of the via hole 106 or wiring groove 107 and then reach the first $SiO_2$ film 103 or SiOF film 116. Therefore, because unexpected electrical connection does not occur between adjacent upper-layer wirings 123, it is possible to prevent the yield of semiconductor device from lowering.

Furthermore, according to the Embodiment 2, it is possible to solve the fourth problem (refer to FIG. 30) of the prior art, that is, prevent the phenomenon that when removing portions of TiN film and Cu film outside a wiring groove by the CMP method, exfoliation occurs at the interface between an inter-layer insulating film provided with a wiring groove and a TiN film and thereby, the yield of semiconductor devices is extremely lowered. The reason is described below. That is, because the Embodiment 2 uses the SiOF film 116 as an inter-layer insulating film, deterioration of adhesiveness occurring when an $SiO_2$ film contacts with a TiN film does not occur even if the TiN film is deposited so as to contact with the surface of the SiOF film 116 and therefore, no exfoliation occurs when applying the CMP method. Moreover, because the Si layer 120 is deposited on the inter-layer insulating film with the first TiN film 118 interposed between the inter-layer insulating film and the Si layer 120, the inter-layer insulating film does not directly contact with the Si layer even if the inter-layer insulating film is a specific type of an insulating film having a low adhesiveness with the Si layer such as an SiOF film. Therefore, when removing portions of the first TiN film 118 and first and second Cu films 113 and 114 outside the wiring groove 107 by, for example, the CMP method and thereby forming the upper-layer wiring 123, it is possible to prevent a laminated wiring structure on the semiconductor substrate 101 from being broken and thereby, prevent the yield of semiconductor devices from lowering.

In the case of the Embodiment 2, it is preferable that the thickness of the CuSix layer 117 is set to a value between 0.5 nm and 20 nm (both included). This is because when the thickness of the CuSix layer 117 becomes smaller than 0.5 nm, the power for preventing movement of oxygen atoms becomes insufficient and moreover, when the thickness of the CuSix layer 117 becomes larger than 20 nm, the connection resistance between the lower-layer wiring 102 and upper-layer wiring 123 is increased due to the resistivity of the CuSix layer 117.

Furthermore, in the case of the Embodiment 2, it is preferable that the total thickness of the first TiSiN layer 119 and second TiSiN layer 121 is set to a value between 0.5 nm and 10 nm (both included). This is because when the total thickness becomes smaller than 0.5 nm, the power for preventing diffusion of Cu atoms becomes insufficient and when the total thickness becomes larger than 10 nm, the thicknesses of the first and second Cu films 113 and 114 embedded in the via hole 106 and wiring groove 107 are decreased and thereby the resistance of the upper-layer wiring 123 increases. Moreover, for the same reason, it is preferable that the total thickness of the first TiN film 118 and second TiN film 122 is set to a value between 0.5 nm and 10 nm (both included) and moreover, the total thickness of the first TiSiN layer 119, second TiSiN layer 121, first TiN film 118, and second TiN film 122 is set to a value between 1 nm and 20 nm (both included).

Furthermore, in the case of the Embodiment 2, the step of holding the semiconductor substrate 101 while heating it at a reduced pressure (refer to FIG. 11) is executed to accelerate uniform formation of the CuSix layer 117 by decomposing the CuOx layer 108 formed at the bottom of the via hole 106 but when the thickness of the CuOx layer 108 is small enough, it is allowed to omit the step. Furthermore, it is preferable that the step is executed under a state in which the partial pressure of $O_2$ in the vacuum chamber is about $1.33 \times 10^{-4}$ Pa or lower. This is because when the partial pressure of $O_2$ becomes higher than about $1.33 \times 10^{-4}$ Pa, the speed at which the surface of a Cu film constituting the lower-layer wiring 102 is oxidized by $O_2$ becomes higher than the speed at which the CuOx layer 108 is decomposed and thereby, the surface of the Cu film cannot be cleaned. Furthermore, it is preferable that the temperature for heating the semiconductor substrate 101 in the above step is set to about 300° C. or higher. This is because when the temperature for heating the semiconductor substrate 101 is set to a value lower than 300° C., the speed at which the CuOx layer 108 is decomposed is greatly lowered and as a result, the surface of a Cu film constituting the lower-layer wiring 102 cannot be cleaned. Furthermore, it is preferable that the time for holding the semiconductor substrate 101 while heating it in the above step is set to about 3 sec or longer. This is because the substrate heating time of at least about 3 sec is required for the clean surface of the Cu film to appear on the lower-layer wiring 102 after the CuOx layer 108 is decomposed.

Furthermore, in the case of the Embodiment 2, it is preferable that the heating temperature of the semiconductor substrate 101 is set to 350° C. or lower in the step of forming the CuSix layer 117 by introducing $SiH_4$ into the vacuum chamber (refer to FIG. 12). This is because when setting the heating temperature of the semiconductor substrate 101 to a value higher than 350° C., the speed of the surface decomposition reaction of $SiH_4$ is extremely increased and thereby, an Si layer is deposited on the surface of the SiOF film 116. Furthermore, in the above step, when assuming the partial pressure of $SiH_4$ in the vacuum chamber as P (Pa) and the time for introducing $SiH_4$ into the vacuum chamber as t (sec), it is preferable to set P and t so that the product P·t of P and t ranges between $6.65 \times 10^{-2}$ and $3.33 \times 10^2$ Pa·sec (both included). This is because when the value of P·t becomes smaller than about $6.65 \times 10^{-2}$ Pa·sec, the thickness of the CuSix layer 117 decreases and the power for preventing movement of oxygen atoms becomes insufficient and when the value of P·t becomes larger than about $3.33 \times 10^2$ Pa·sec, the thickness of the CuSix layer 117 becomes excessive and the connection resistance between the lower-layer wiring 102 and upper-layer wiring 123 is increased due to the resistivity of the CuSix layer 117.

Furthermore, in the case of the Embodiment 2, it is preferable to set the heating temperature of the semiconductor substrate 101 to 350° C. or higher in the step of forming the first TiSiN layer 119 and depositing the Si layer 120 by introducing $SiH_4$ into the vacuum chamber (refer to FIG. 14). This is because when setting the heating temperature of the semiconductor substrate 101 to a value lower than 350° C., the speed for $SiH_4$ to diffuse in the first TiN film 118 lowers and the first TiSiN layer 119 is not formed and moreover, the speed of the surface decomposition reaction of $SiH_4$ greatly lowers and thereby the Si layer 120 is not deposited. Furthermore, in the above step, when assuming he partial pressure of $SiH_4$ in the vacuum chamber as P (Pa) and the time for introducing $SiH_4$ into the vacuum chamber as t (sec), it is preferable to set P and t so that the product P·t of P and t becomes about $1.33 \times 10^{-2}$ Pa·sec or more. This is because when the value of P·t becomes smaller than about $1.33 \times 10^{-2}$ Pa·sec, the thicknesses of the first TiSiN layer 119 and Si layer 120 become insufficient and as a result, the total thickness of the first TiSiN layer 119 and second TiSiN layer 121 becomes insufficient to prevent Cu atoms from diffusing.

Furthermore, in the case of the Embodiment 2, the whole Si layer 120 is replaced with the second TiSiN layer 121 by making Si atoms in the Si layer 120 react with TDMAT in the step of forming the second TiSiN layer 121 and depositing the second TiN film 122 by introducing TDMAT into the vacuum chamber (refer to FIG. 15). Instead, however, it is allowed to form the second TiSiN layer 121 so that the Si layer 120 locally remains.

Embodiment 3

The semiconductor device and its fabrication method of the Embodiment 3 of the present invention are described below by referring to the accompanying drawings.

Figure 19:
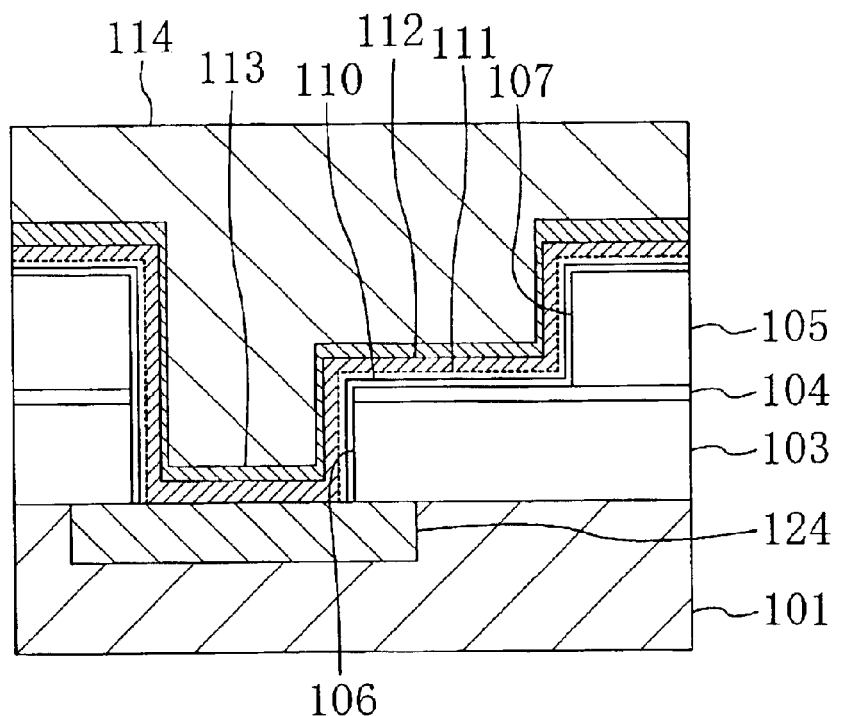
FIG. 19 is a sectional view showing a step of a fabrication method of a semiconductor device of an Embodiment 3 of the present invention.

FIG. 19 is a sectional view showing a step of the fabrication method of the semiconductor device of the Embodiment 3 of the present invention, which corresponds to the step of the Embodiment 1 shown in FIG. 6. In FIG. 19, a member same as that of the Embodiment 1 shown in FIGS. 1 to 7 is provided with the same symbol and its description is omitted.

In the case of the Embodiments 1 and 2, a CuSix (x>0) layer is formed in the portion of a lower-layer wiring connecting with a via hole. In the case of the Embodiment 3, however, a CuSix layer is not formed in the portion of a lower-layer wiring connecting with a via hole.

Specifically, the Embodiment 3 is different from the Embodiment 1 in that as shown in FIG. 19, a lower-layer wiring 124 made of a conductive film other than a Cu film, such as a tungsten (W) film, is formed on the surface of a semiconductor substrate 101. In this case, a W film instead of a Cu film is exposed to the bottom of a via hole 106 when the via hole 106 is formed. Therefore, even if the semiconductor substrate 101 is exposed to $SiH_4$ in a vacuum chamber (not illustrated) after forming the vial hole 106, a CuSix layer is not formed on a lower-layer wiring 124. However, an Si layer 110 is deposited on surfaces of a first $SiO_2$ film 103, $Si_3N_4$ film 104, and second $SiO_2$ film 105 respectively and then, a part of the Si layer 110 reacts with TDMAT and thereby, a TiSiN layer 111 is formed.

That is, according to the Embodiment 3, it is possible to effectively avoid that Cu atoms constituting a first Cu film 113 and second Cu film 114 diffuse to the first $SiO_2$ film 103 and second $SiO_2$ film 105 because wall surfaces of the via hole 106 and a wiring groove 107 are respectively covered with a TiSiN layer 111 the same as the case of the Embodiment 1.

Moreover, according to the Embodiment 3, the adhesiveness between the second $SiO_2$ film 105 and a TiN film 112 is improved because the Si layer 110 and TiSiN layer 111 are present between the second $SiO_2$ film 105 provided with the wiring groove 107 and the TiN film 112 the same as the case of the Embodiment 1.

Embodiment 4

The semiconductor device and its fabrication method of the Embodiment 4 of the present invention are described below by referring to the accompanying drawings.

Figure 20:
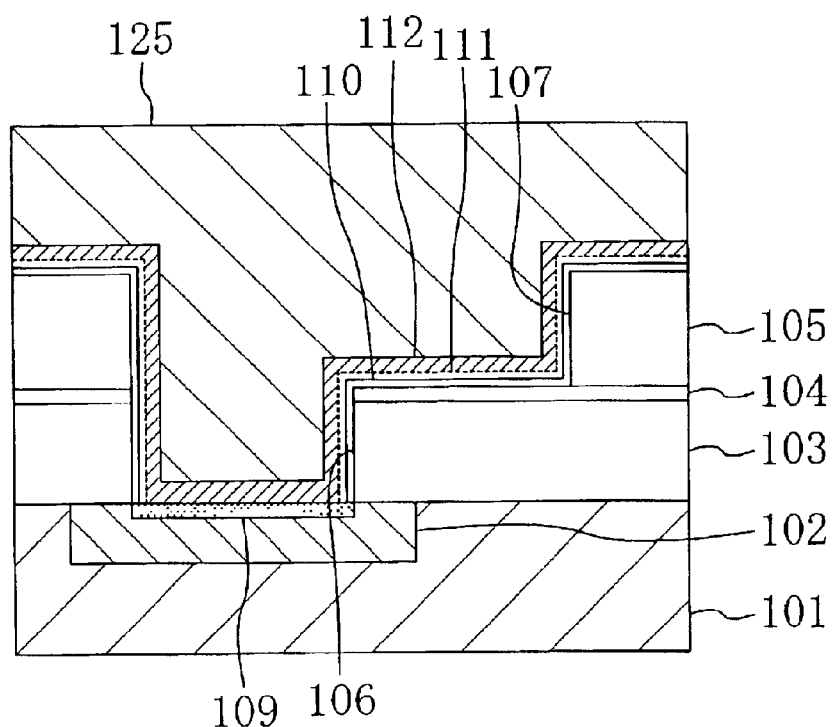
FIG. 20 is a sectional view showing a step of a fabrication method of a semiconductor device of an Embodiment 4 of the present invention.
Figure 21:
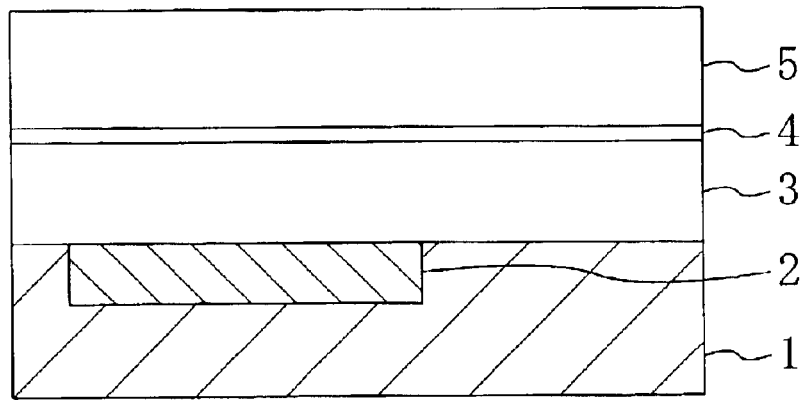
FIG. 21 is a sectional view showing a step of a fabrication method of a conventional semiconductor device.
Figure 22:
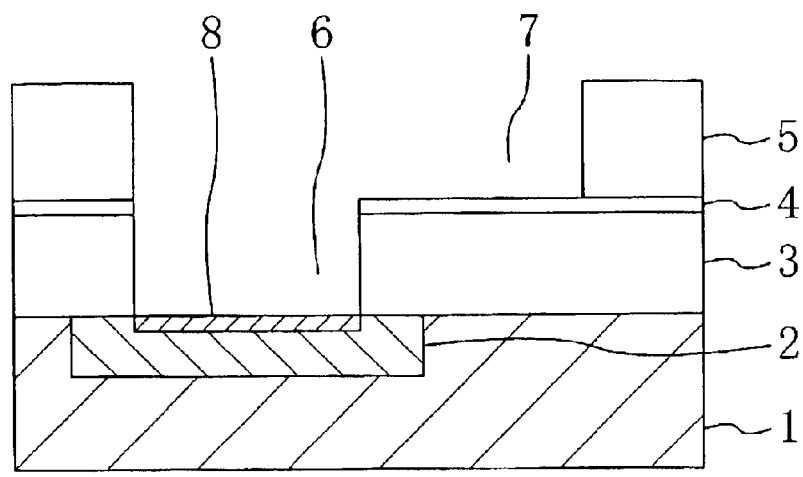
FIG. 22 is a sectional view showing a step of the fabrication method of the conventional semiconductor device.
Figure 23:
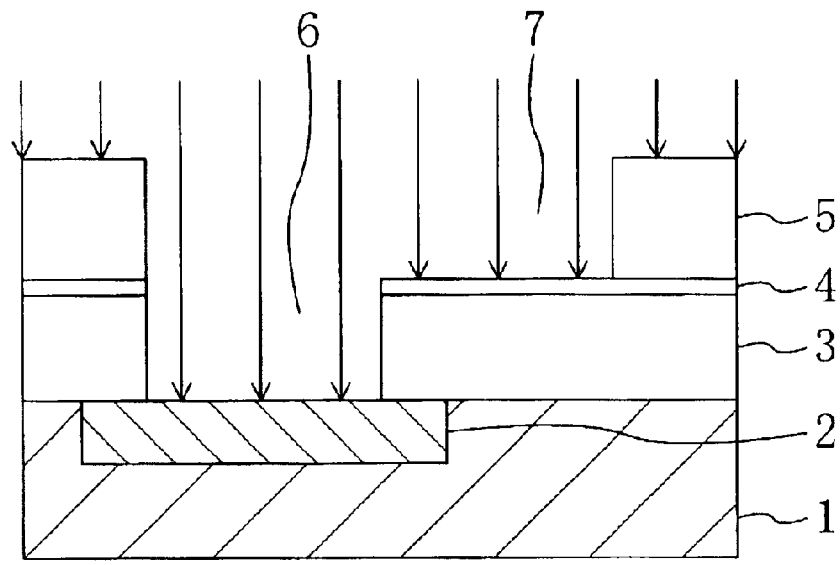
FIG. 23 is a sectional view showing a step of the fabrication method of the conventional semiconductor device.
Figure 24:
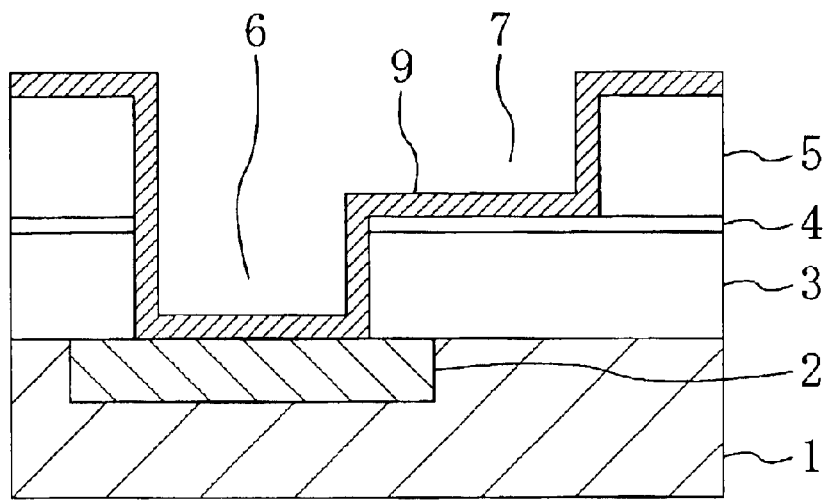
FIG. 24 is a sectional view showing a step of the fabrication method of the conventional semiconductor device.
Figure 25:
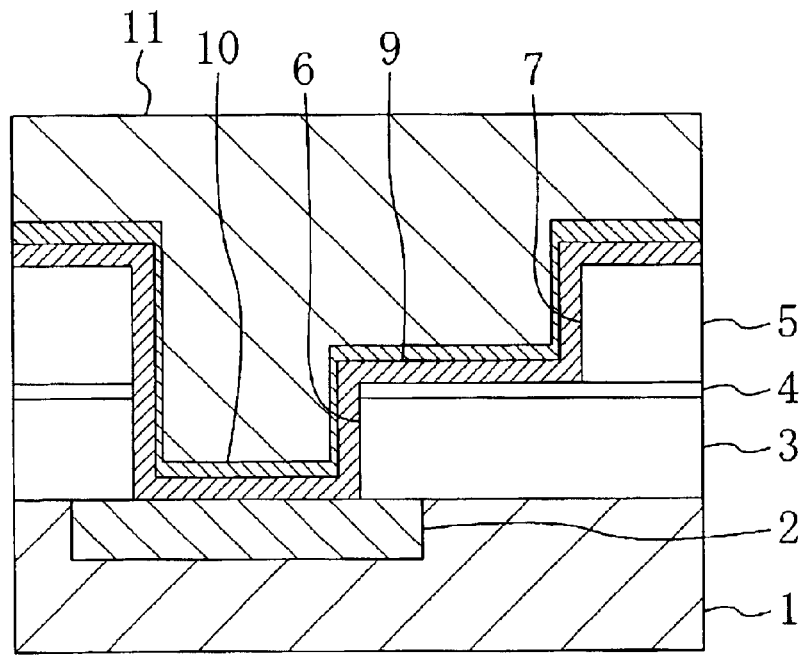
FIG. 25 is a sectional view showing a step of the fabrication method of the conventional semiconductor device.
Figure 26:
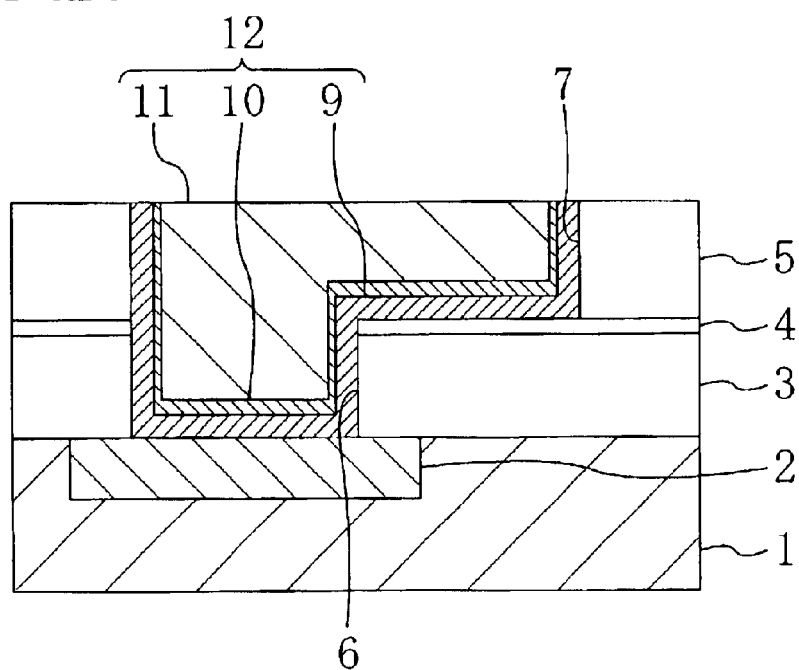
FIG. 26 is a sectional view showing a step of the fabrication method of the conventional semiconductor device.

FIG. 20 is a sectional view showing a step of the fabrication method of the semiconductor device of the Embodiment 4 of the present invention, which corresponds to the step of the Embodiment 1 shown in FIG. 6. In FIG. 20, a member same as that of the Embodiment 1 shown in FIGS. 1 to 7 is provided with the same symbol and its description is omitted.

In the case of the Embodiments 1 to 3, a Cu film is used to embed the via hole 106 and wiring groove 107. In the case of the Embodiment 4, however, a conductive film other than a Cu film, such as a W film, is used to embed a via hole 106 and wiring groove 107.

Specifically, the Embodiment 4 is different from the Embodiment 1 in that as shown in FIG. 20, a W film 125 is formed on a TiN film 112 formed as a barrier metal film on a second $SiO_2$ film 105 including the via hole 106 and wiring groove 107 so that the via hole 106 and wiring groove 107 are completely embedded.

In the case of the Embodiment 4, it is not important to prevent the phenomenon in which W atoms diffuse from the W film 125 into a first $SiO_2$ film 103 or second $SiO_2$ film 105 because W atoms do not form mobile ions in an $SiO_2$ film.

In the case of the Embodiment 4, however, to avoid that exfoliation occurs at the interface between the second $SiO_2$ film 105 and TiN film 112 when forming an upper-layer wiring by removing portions of the TiN film 112, W film 125 and the like, outside the wiring groove 107, an Si layer 110 and TiSiN layer 111 are formed between the second $SiO_2$ film 105 and TiN film 112 to improve the adhesiveness between the second $SiO_2$ film 105 and TiN film 112 the same as the case of the Embodiment 1.

Moreover, according to the Embodiment 4, because a lower-layer wiring 102 is formed by using a Cu film, it is prevented that oxygen atoms implanted in the Cu film constituted the lower-layer wiring 102 when forming the via hole 106 reach the TiN film 112 and, for example, a $TiO_2$ layer is formed, by forming a CuSix layer 109 in the portion of the lower-layer wiring 102 contacting with the TiN film 112 the same as the case of the Embodiment 1.

Though the present invention is described about four embodiments, the present invention is not restricted to these embodiments.

For example, in the case of the Embodiments 1 to 4, a method referred to as "dual damacine method" is used in which a via hole and wiring groove are continuously formed and then insides of the via hole and wiring groove are filled with a Cu film or the like. However, instead of the above method, it is also allowed to use a method referred to as "single damacine method" of forming a via hole or wiring groove and then filling the inside of the via hole or wiring groove with a Cu film or the like.

Furthermore, in the case of the Embodiments 1 to 4, an $SiO_2$ film, $Si_3N_4$ film, or SiOF film is used as an inter-layer insulating film. However, it is also allowed to use other film such as an organic compound film having an insulating characteristic instead of or in addition to the above $SiO_2$ film, $Si_3N_4$ film, or SiOF film.

Furthermore, in the case of the Embodiments 1 to 4, $SiH_4$ is used to form a CuSix layer or deposit an Si layer. However, it is also allowed to use other silicon compound such as disilane ($Si_2H_4$) or trisilane ($Si_3H_8$).

Furthermore, in the case of the Embodiments 1 to 4, a CuSix layer is formed or an Si layer is deposited by using a method of exposing the surface of a semiconductor substrate to a silicon compound. However, it is also allowed to use other method of efficiently supplying Si atoms to the surface of a semiconductor substrate such as a method of exposing the surface of a semiconductor substrate to radicals or ions containing Si.

Furthermore, in the case of the Embodiments 1 to 4, a TiN film (such as the first TiN film 118 formed on the surface of the SiOF film 116 in the Embodiment 2) is used as a barrier metal film. However, it is also allowed to use other refractory metal such as a tantalum (Ta) film, tantalum nitride (TaN) film, or tungsten nitride (WN) film, instead of the TiN film.

Furthermore, in the case of the Embodiments 1 to 4, TDMAT is used to form a TiN film. However, it is also allowed to use other compound containing Ti such as tetrakisdiethylaminotitanium (TDEAT) or tetrakismethylethylamiotitanium (TMEAT).

Furthermore, in the case of the Embodiments 1 to 4, a Cu film is used as a wiring metal film. However, it is allowed to use a copper alloy film or a laminated film containing a Cu film instead of the Cu film.

Furthermore, it is needless to say that the above embodiments can be applied by modifying them as long as they do not deviate from the gist of the present invention.

What is claimed is:

1. A semiconductor device comprising:
   a lower-layer wiring made of copper or a copper alloy and formed on a semiconductor substrate;
   an insulating film deposited on the lower-layer wiring and provided with a via hole reaching the lower-layer wiring; and
   a barrier metal film deposited in the via hole;
   wherein a copper silicide layer is formed between the lower-layer wiring and the barrier metal film.

2. The semiconductor device according to claim 1, wherein the thickness of the copper silicide layer ranges between 0.5 nm and 20 nm (both included).

3. The semiconductor device according to claim 1, wherein the barrier metal film is a titanium nitride film.

4. A semiconductor device comprising:
   an insulating film deposited on a semiconductor substrate and provided with a concave portion; and
   a wiring metal film made of copper or a copper alloy and embedded in the concave portion;
   wherein a titanium nitride silicide layer and a titanium nitride film are formed in order from the insulating-film side between the insulating film and the wiring metal film.

5. The semiconductor device according to claim 4, wherein the thickness of the titanium-nitride-silicide layer ranges between 0.5 nm and 10 nm (both included).

6. The semiconductor device according to claim 4, wherein the thickness of the titanium nitride film ranges between 0.5 nm and 10 nm (both included).

7. A semiconductor device comprising:
   an insulating film deposited on a semiconductor substrate and provided with a concave portion; and
   a wiring metal film made of copper or a copper alloy and embedded in the concave portion;
   wherein a metal film, titanium-nitride-silicide layer, and titanium nitride film are formed in order from the insulating-film side between the insulating film and the wiring metal film.

8. The semiconductor device according to claim 7, wherein the metal film is another titanium nitride film.

9. The semiconductor device according to claim 7, wherein the thickness of the titanium-nitride-silicide layer ranges between 0.5 nm and 10 nm (both included).

10. The semiconductor device according to claim 7, wherein the thickness of the titanium nitride film ranges between 0.5 nm and 10 nm (both included).

11. A method for fabricating a semiconductor device, comprising:
   a step of forming a lower-layer wiring made of copper or a copper alloy on a semiconductor substrate;
   a step of forming an insulating film having a via hole reaching the lower-layer wiring on the lower-layer wiring;
   a step of forming a copper silicide layer on the portion of the lower-layer wiring exposed to the via hole; and
   a step of depositing a barrier metal film on the copper silicide layer in the via hole.

12. The method for fabricating a semiconductor device according to claim 11, wherein the step of forming the copper silicide layer includes a step of exposing the portion of the lower-layer wiring exposed to the via hole to silane.

13. The method for fabricating a semiconductor device according to claim 12, wherein the step of exposing the portion to the silane includes a step of setting the temperature for heating the semiconductor substrate to 350° C. or higher and moreover setting the product of the partial pressure of the silane and the time for exposing the portion to the silane to about 6.65×10 Pa·sec or less.

14. The method for fabricating a semiconductor device according to claim 12, wherein the step of exposing the portion to the silane includes a step of setting the temperature for heating the semiconductor substrate to 350° C. or lower and moreover setting the product of the partial pressure of the silane and the time for exposing the portion to the silane to a value between about $6.65 \times 10^{-2}$ and about $3.33 \times 10^2$ Pa·sec (both included).

15. The method for fabricating a semiconductor device according to claim 12, wherein the step of forming the copper suicide layer includes a step of heating the semiconductor substrate at a reduced pressure before the step of exposing the portion to the silane.

16. The method for fabricating a semiconductor device according to claim 15, wherein the step of heating the semiconductor substrate includes a step of setting the partial pressure of oxygen to about $1.33 \times 10^{-4}$ Pa or lower and moreover setting the temperature and time for heating the semiconductor substrate to about 300° C. or higher and about 3 sec or longer.

17. A method for fabricating a semiconductor device comprising:
   a step of forming an insulating film having a concave portion on a semiconductor substrate;
   a step of depositing a silicon layer and a titanium nitride film in order on the insulating film so that the concave portion is embedded up to the middle of it; and
   a step of depositing a wiring metal film made of copper or a copper alloy on the titanium nitride film so that the concave portion is completely embedded;
   wherein the titanium nitride film is deposited by the chemical vapor deposition method using a compound containing titanium, and thereby a titanium-nitride-silicide layer is formed between the insulating film and the titanium nitride film.

18. The method for fabricating a semiconductor device according to claim 17, wherein the silicon layer is deposited by exposing the surface of the insulating film including the inside of the concave portion to silane.

19. The method for fabricating a semiconductor device according to claim 18, wherein when exposing the surface to the silane, the temperature for heating the semiconductor substrate is set to 350° C. or higher and the product of the partial pressure of the silane and the time for exposing the surface to the silane is set to about $1.33 \times 10^{-2}$ Pa·sec or more.

20. A method for fabricating a semiconductor device, comprising:
   a step of forming an insulating film having a concave portion on a semiconductor substrate;
   a step of depositing a metal film, silicon layer, and titanium nitride film in order on the insulating film so that the concave portion is embedded up to the middle of it; and
   a step of depositing a wiring metal film made of copper or a copper alloy on the titanium nitride film so that the concave portion is completely embedded;
   wherein the titanium nitride film is deposited by the chemical vapor deposition method using a compound containing titanium, and thereby a titanium-nitride-silicide layer is formed between the metal film and the titanium nitride film.

21. The method for fabricating a semiconductor device according to claim 20, wherein the metal film is another titanium nitride film.

22. The method for fabricating a semiconductor device according to claim 20, wherein the silicon layer is deposited by exposing the surface of the metal film including the inside of the concave portion to silane.

23. The method for fabricating a semiconductor device according to claim 22, wherein when exposing the surface to the silane, the temperature for heating the semiconductor substrate is set to 350° C. or higher and the product of the partial pressure of the silane and the time for exposing the surface to the silane is set to about $1.33 \times 10^{-2}$ Pa·sec or more.

* * * * *